(12) United States Patent
Kirkpatrick

(10) Patent No.: US 8,926,414 B1
(45) Date of Patent: Jan. 6, 2015

(54) APPARATUS FOR SUPPORTING AND COOLING AN ELECTRONIC DEVICE

(71) Applicant: Chad Kirkpatrick, Portland, OR (US)

(72) Inventor: Chad Kirkpatrick, Portland, OR (US)

( * ) Notice: Subject to any disclaimer, the term of this patent is extended or adjusted under 35 U.S.C. 154(b) by 0 days.

(21) Appl. No.: 14/205,882

(22) Filed: Mar. 12, 2014

Related U.S. Application Data

(60) Provisional application No. 61/790,520, filed on Mar. 15, 2013.

(51) Int. Cl.
*H05K 5/00* (2006.01)
*H05K 7/20* (2006.01)

(52) U.S. Cl.
CPC .................... *H05K 7/20136* (2013.01)
USPC ...................... 454/184; 361/679.41

(58) Field of Classification Search
USPC .......................... 454/184; 361/679.48, 679.41
See application file for complete search history.

(56) References Cited

U.S. PATENT DOCUMENTS

| | | | |
|---|---|---|---|
| 4,383,286 A | 5/1983 | Hicks | |
| 5,381,043 A * | 1/1995 | Kohiyama et al. | 307/116 |
| 5,557,562 A * | 9/1996 | Yoshiharu et al. | 361/679.41 |
| 5,636,103 A | 6/1997 | Bushner | |
| 5,704,212 A * | 1/1998 | Erler et al. | 62/3.2 |
| 5,768,101 A * | 6/1998 | Cheng | 361/679.41 |
| 5,774,332 A * | 6/1998 | Ruch et al. | 361/679.41 |
| 6,038,128 A | 3/2000 | Hood | |
| 6,213,866 B1 | 4/2001 | Impellizzeri | |
| 6,239,971 B1 | 5/2001 | Yu | |
| 6,259,601 B1 * | 7/2001 | Jaggers et al. | 361/690 |
| 6,522,535 B1 * | 2/2003 | Helot et al. | 361/679.49 |
| 6,545,864 B2 * | 4/2003 | Davis, IV | 361/679.55 |
| 6,583,984 B2 * | 6/2003 | Yin et al. | 361/679.27 |
| 6,674,640 B2 | 1/2004 | Pokharna | |
| 6,691,197 B2 * | 2/2004 | Olson et al. | 710/304 |
| 6,707,668 B2 | 3/2004 | Huang | |
| 6,711,014 B2 * | 3/2004 | Anzai et al. | 361/679.48 |
| 6,738,256 B2 | 5/2004 | Hsieh | |
| 6,837,058 B1 * | 1/2005 | McEuen et al. | 62/3.2 |
| 7,116,554 B2 * | 10/2006 | Lee et al. | 361/695 |
| D555,162 S | 11/2007 | Park | |
| 7,375,967 B2 * | 5/2008 | Huang et al. | 361/707 |
| D574,005 S | 7/2008 | Chung | |
| D578,130 S | 10/2008 | Sween | |
| 7,480,140 B2 * | 1/2009 | Hara et al. | 361/692 |
| 7,480,141 B2 * | 1/2009 | Takenoshita et al. | 361/695 |
| 7,502,225 B2 * | 3/2009 | Solomon et al. | 361/679.41 |
| D590,404 S | 4/2009 | Kim | |
| D618,691 S | 6/2010 | Seo | |
| D619,139 S | 7/2010 | Ho | |
| 7,764,501 B2 * | 7/2010 | Gu et al. | 361/700 |
| D622,274 S * | 8/2010 | Green | D14/447 |
| 7,800,903 B2 | 9/2010 | Wang | |
| 7,830,661 B2 | 11/2010 | Sween | |
| RE42,054 E | 1/2011 | Park | |
| 7,885,068 B2 * | 2/2011 | Seo et al. | 361/695 |
| D637,194 S * | 5/2011 | Kuroda et al. | D14/447 |
| D648,339 S * | 11/2011 | O'Neil et al. | D14/434 |
| 8,164,222 B2 * | 4/2012 | Baarman | 307/104 |
| D671,543 S * | 11/2012 | Sogabe | D14/447 |

(Continued)

*Primary Examiner* — Steven B McAllister
*Assistant Examiner* — Jonathan Cotov

(57) ABSTRACT

An apparatus for supporting and cooling an electronic device and methods of using the apparatus. The apparatus can include a housing for a cooling system and a support cradle for receiving the electronic device and engaging the electronic device with the cooling system.

19 Claims, 32 Drawing Sheets

(56) References Cited

U.S. PATENT DOCUMENTS

| | | | |
|---|---|---|---|
| D692,009 S * | 10/2013 | Ashida et al. | D14/447 |
| 8,638,552 B1 * | 1/2014 | Tuero | 361/679.41 |
| 8,773,850 B2 * | 7/2014 | Minaguchi et al. | 361/679.44 |
| 2004/0190238 A1 * | 9/2004 | Hubbard | 361/683 |
| 2005/0162824 A1 * | 7/2005 | Thompson | 361/686 |
| 2006/0056151 A1 * | 3/2006 | Hara et al. | 361/696 |
| 2006/0126289 A1 * | 6/2006 | Takenoshita et al. | 361/687 |
| 2006/0262497 A1 * | 11/2006 | Jahlokov | 361/683 |
| 2007/0291451 A1 * | 12/2007 | Takenoshita et al. | 361/697 |
| 2009/0179131 A1 * | 7/2009 | Lord et al. | 248/346.5 |
| 2012/0194993 A1 * | 8/2012 | Oguchi et al. | 361/679.41 |
| 2012/0327581 A1 * | 12/2012 | Pais et al. | 361/679.26 |
| 2013/0114203 A1 * | 5/2013 | Ignatchenko et al. | 361/679.41 |

\* cited by examiner

APPARATUS FOR SUPPORTING AND COOLING AN ELECTRONIC DEVICE

CROSS-REFERENCE TO RELATED APPLICATIONS

This application claims the benefit of U.S. Provisional Patent Application No. 61/790,520, filed Mar. 15, 2013, which is incorporated herein by reference in its entirety.

FIELD

This disclosure relates to electronic devices and, more particularly, to systems and methods for supporting and cooling electronic devices.

BACKGROUND

Heat generated by electronic devices can degrade their performance and, in some cases, cause irreparable damage to the devices. Some electronic equipment, such as laptop computers, have internal cooling systems that attempt to reduce the problems associated with heat generation. These internal cooling systems do not adequately solve the problem of heat generation with such electronic devices. Accordingly, improvements systems and methods for cooling electronic devices are desirable.

SUMMARY

The foregoing and other objects, features, and advantages of the invention will become more apparent from the following detailed description, which proceeds with reference to the accompanying figures.

LIST OF FIGURES

DETAILED DESCRIPTION

Figure 1:
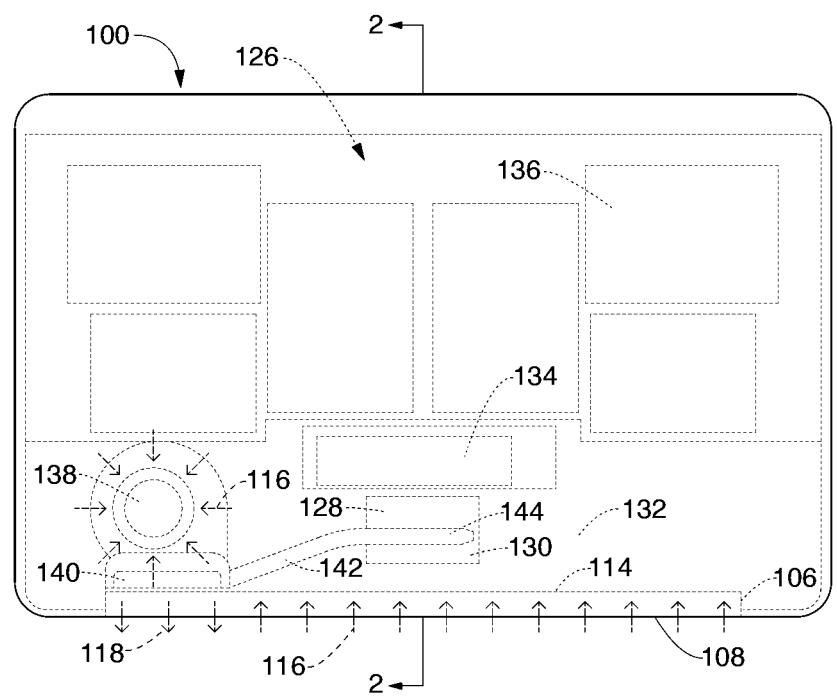
FIG. 1 illustrates an example of a compact laptop computer device in top view with dashed line internal components and air vent movement.

For purposes of this description, certain aspects, advantages, and novel features of the embodiments of this disclosure are described herein. The disclosed methods, apparatuses, and systems should not be construed as limiting in any way. Instead, the present disclosure is directed toward all novel and non-obvious features and aspects of the various disclosed embodiments, alone and in various combinations and sub-combinations with one another. The methods, apparatus, and systems are not limited to any specific aspect or feature or combination thereof, nor do the disclosed embodiments require that any one or more specific advantages be present or problems be solved. As will be obvious to one of ordinary skill in the art, the various embodiments can be combined to form many different combinations, all of which are intended to be incorporated by this disclosure. For example, unless the disclosure or figures require otherwise, a fan of one shape or configuration described in one embodiment can be substituted for a fan of a different shape or configuration disclosed in another embodiment.

Although the operations of some of the disclosed methods are described in a particular, sequential order for convenient presentation, it should be understood that this manner of description encompasses re-arrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "determine" and "provide" to describe the disclosed methods. These terms are high-level abstractions of the actual operations that are performed. The actual operations that correspond to these terms may vary depending on the particular implementation and are readily discernible by one of ordinary skill in the art.

The use of similar or identical reference numbers in the various drawings is intended to indicate the presence of a similar or identical element or feature, unless the description clearly shows that the element or feature has a structure or operation that is contrary to the other similar reference numbers.

Exemplary Electronic Devices

Although the examples discussed herein focus on laptop computers, it will be understood that other electronic devices can be used with the cooling systems and methods described herein. As such, the electronic devices illustrated in the embodiments described herein are intended to be exemplary of a device that can benefit from the support and cooling capabilities provided by the structures disclosed herein. In addition, it should be understood that these electronic devices can vary in shape, size, cooling system, air vent type and location, built-in display screen configuration, input component configuration, and construction materials. The instant disclosure is intended to cover such variations as one of ordinary skill in the art would understand are encompassed by the invention disclosed herein.

Figure 2:
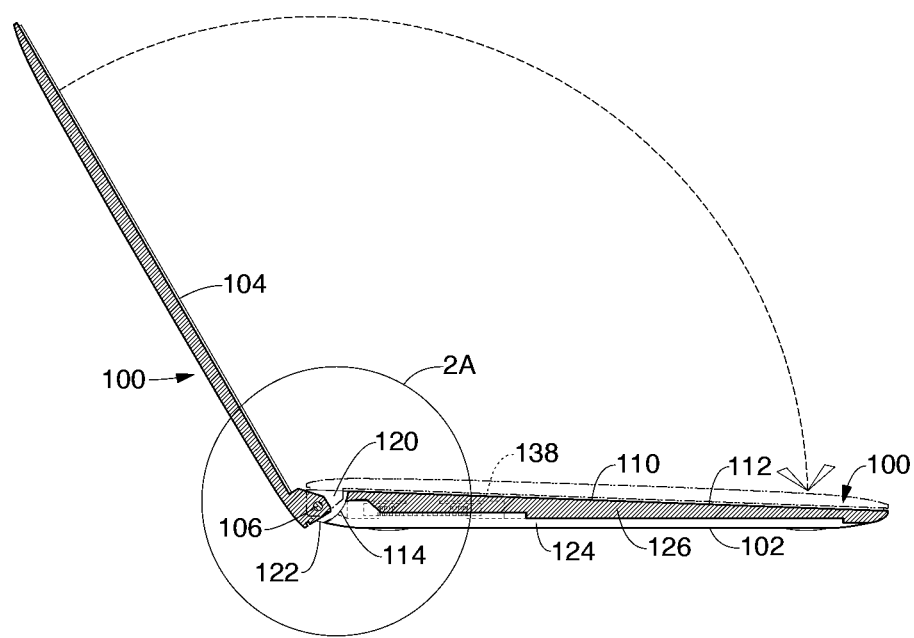
FIG. 2 illustrates an example of a compact laptop computer device in cross-section view with screen opening and closing movement.
Figure 2A:
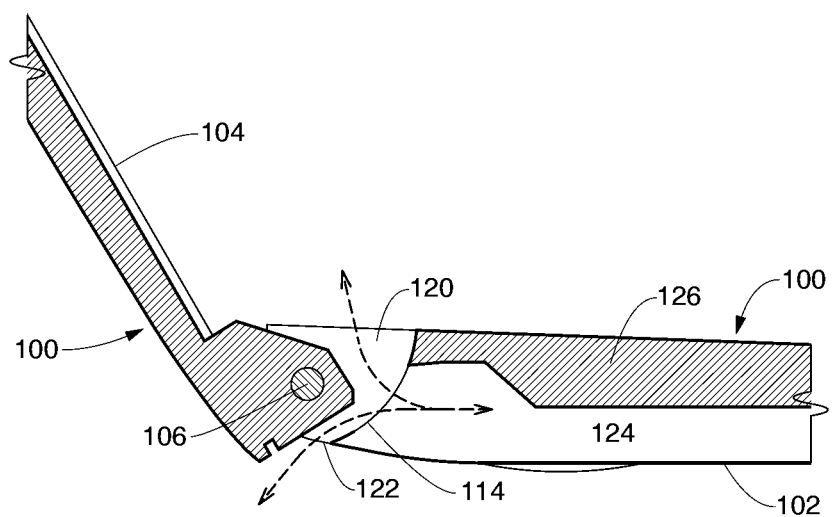
FIG. 2A illustrates an example of a compact laptop computer device in enlarged cross-section view with open screen air movement.
Figure 3:
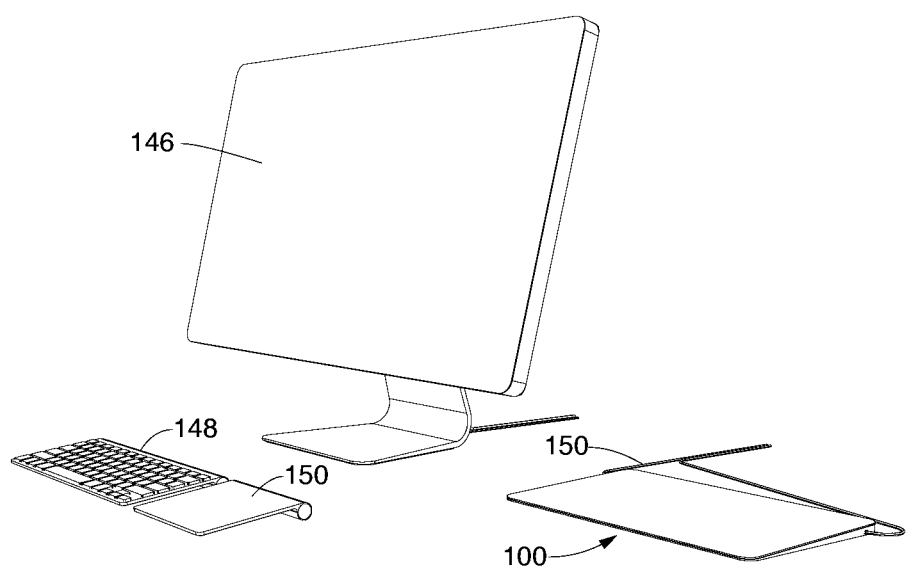
FIG. 3 illustrates an example of a compact laptop computer device in front perspective view with external monitor and external keyboard/mouse.

An example electronic device with which one or more embodiments interact. FIGS. 1 to 3 illustrate an ultra-compact to small sized mobile computer with built-in keyboard, touch pad, and screen, as an example of an electronic device most commonly referred to as a laptop but may go by other names, such as ultrabook, netbook, subnotebook, notebook, smartbook, tablet laptop, ultraportable laptop, and mini laptop. FIG. 1 illustrates the laptop in plan view with internal components diagramed in dashed line and internal air movement indicated by dashed lined arrows. FIG. 2 illustrates the laptop in cross-section with internal cooling fan, rear vent, and a built-in screen opened, with phantom lines showing screen movement. FIG. 2A illustrates an enlarged view of FIG. 2 with open screen air movement. FIG. 3 illustrates the laptop in front perspective view with an external monitor and external keyboard/mouse.

The laptop has an aluminum enclosure and structural frame 100, with a removable aluminum enclosure bottom panel 102. The laptop has a screen 104 connected to the enclosure 100 by a rotating screen hinge 106 located along the back edge 108. Rotating the screen 104 open exposes a keyboard interface 110 and a touch surface interface 112. The laptop has an air vent 114 located between the hinge 106, the enclosure 100, and the bottom panel 102. The air vent 114 allows airflow in both directions, providing fresh cool intake airflow 116 and waste hot exhaust airflow 118. With the screen 104 in an open position, the air vent 114 has airflow through an open air gap 120 between the screen 104 and hinge 106, as well as airflow through an bottom panel air slot opening 122 along the back edge of the enclosure's bottom panel 102. With the screen 104 in a closed position, the air vent 114 has airflow through the bottom panel air slot opening 122. The air vent 114 leads into an air chamber 124 located between internal electronic components 126 and bottom panel 102. The internal electronic components 126 include a central processing unit (CPU) 128 with an on-chip graphics processing unit (GPU) 130, logic board 132, memory and storage 134, battery cells 136, and a cooling system that consists of an internal cooling fan 138 connected to a heat exchanger 140 with cooling fins connected to a heat pipe 142 connected to heat sink 144 connected to the CPU 128.

The fan 138 pulls cool air 116 through the air vent 114 and into the air chamber 124, where the cool air 116 then passes over and cools the internal electronic components 126, then the fan 138 pulls the cool air 116 through and push it through the heat exchanger 140 to extract heat from the CPU 128 via the heat sink 144 and heat pipe 142, and finally the fan 138 exhausts waste hot air 118 out the air vent 114. When internal laptop temperatures exceed external ambient temperatures, the aluminum enclosure and structural frame 100 and bottom panel 102 absorb heat from internal electronic components 126 and transfers that heat to the surrounding environment by radiation and conduction. Reducing temperature of the laptop's internal electronic components 126, enclosure 100, and bottom panel 102 improves performance, speeds up cool down, reduces heat stresses on all laptop parts, reduces the occurrence of premature failure, and extends overall durability. The laptop's screen 104, keyboard 110, and touch interface 112 operate the laptop. Adding an external monitor 146, external keyboard 148, and/or external mouse 150 supplements or replace the laptop's screen 104, keyboard 110, and touch surface 112. Connecting the laptop to an external power supply 152, external monitor 146, external keyboard 148, and external mouse 150 allows the laptop to operate with the screen 104 closed and without the use of the laptop's screen 104, keyboard 110, and touch surface 112, as shown in FIG. 3.

Figure 4:
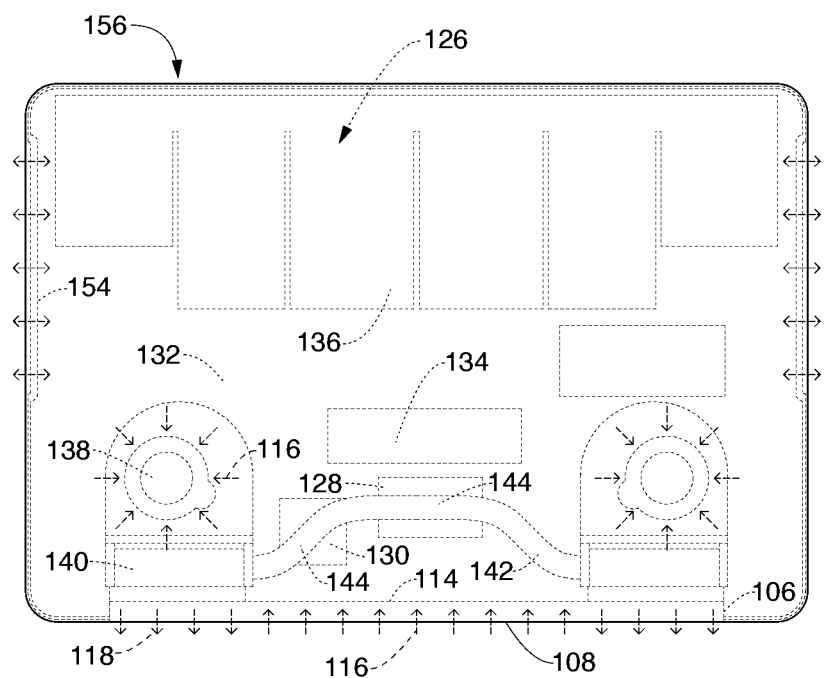
FIG. 4 illustrates an example of a full sized professional laptop computer device in top view with dashed line internal components and air vent movement.

Another example electronic device with which one or more embodiments interact is shown in FIG. 4, which illustrates a medium to large sized mobile computer with built-in keyboard, touch pad, and screen, as an example of an electronic device most commonly referred to as a laptop but may go by other names, such as notebook, smart book, rugged laptop, gaming laptop, professional laptop, and mobile desktop replacement computer. FIG. 4 illustrates the laptop in plan view with internal components diagramed in dashed line and internal air movement indicated by dashed lined arrows.

This laptop's description and operation is similar to the laptop shown in FIGS. 1 to 3, with the following modifications: The laptop has a larger aluminum enclosure and structural frame 156. The laptop includes a separate dedicated graphic processing unit (GPU) 130. The laptop includes two internal cooling fans 138. The laptop includes side air vents 154 that allows airflow in both directions.

Systems and Methods for Supporting and Cooling Devices

Figure 5:
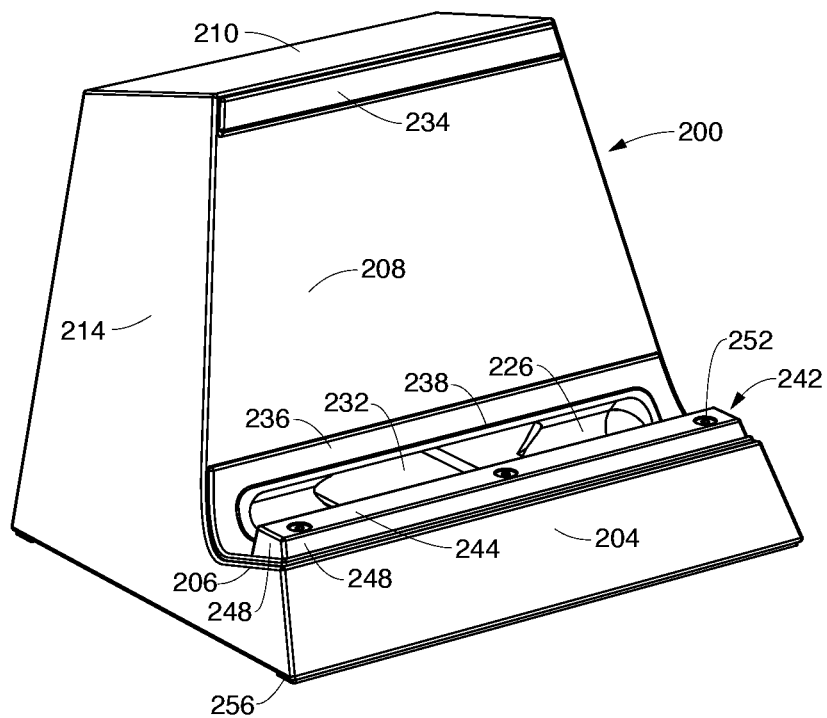
FIG. 5 illustrates an embodiment in front top right perspective view without example laptop.
Figure 6:
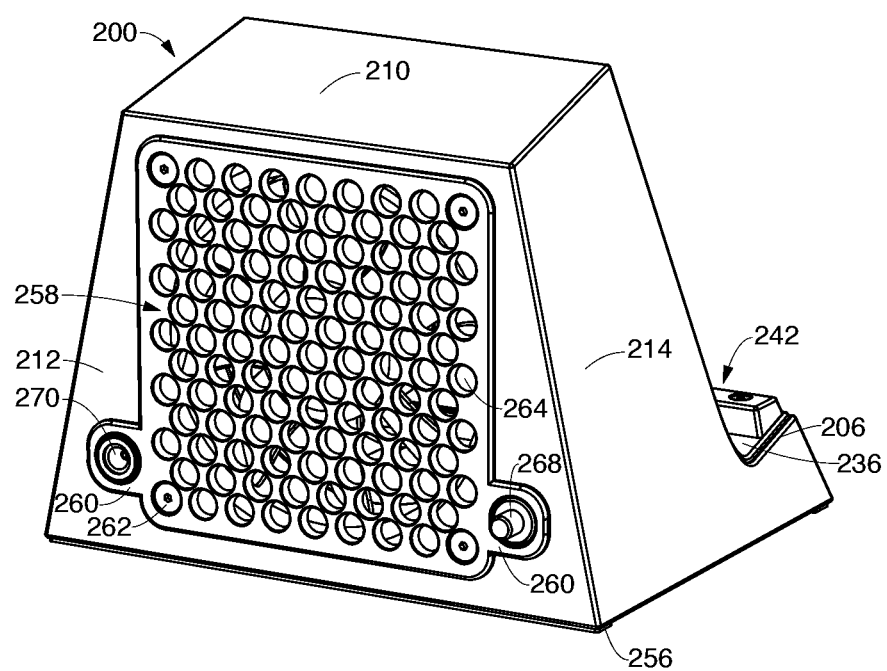
FIG. 6 illustrates an embodiment in back top left perspective view without example laptop.
Figure 7:
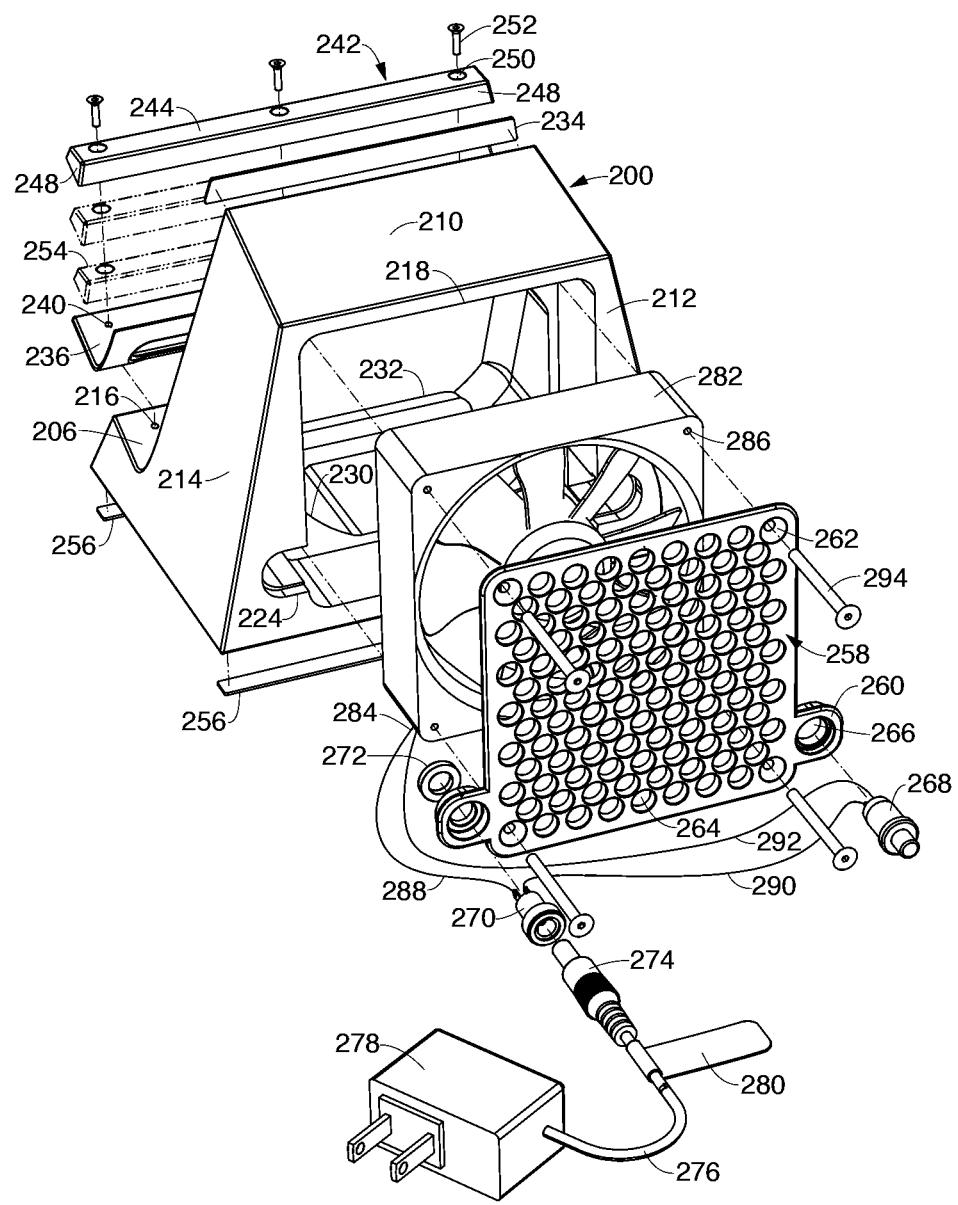
FIG. 7 illustrates an embodiment in exploded assembly view without example laptop.
Figure 8:
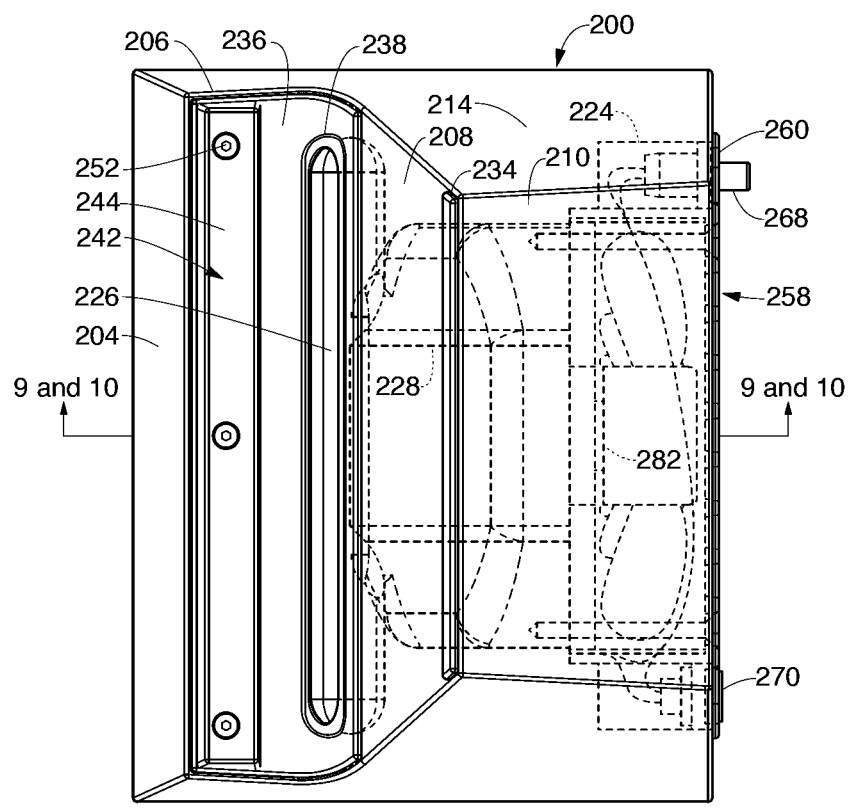
FIG. 8 illustrates an embodiment in top view without example laptop.
Figure 9:
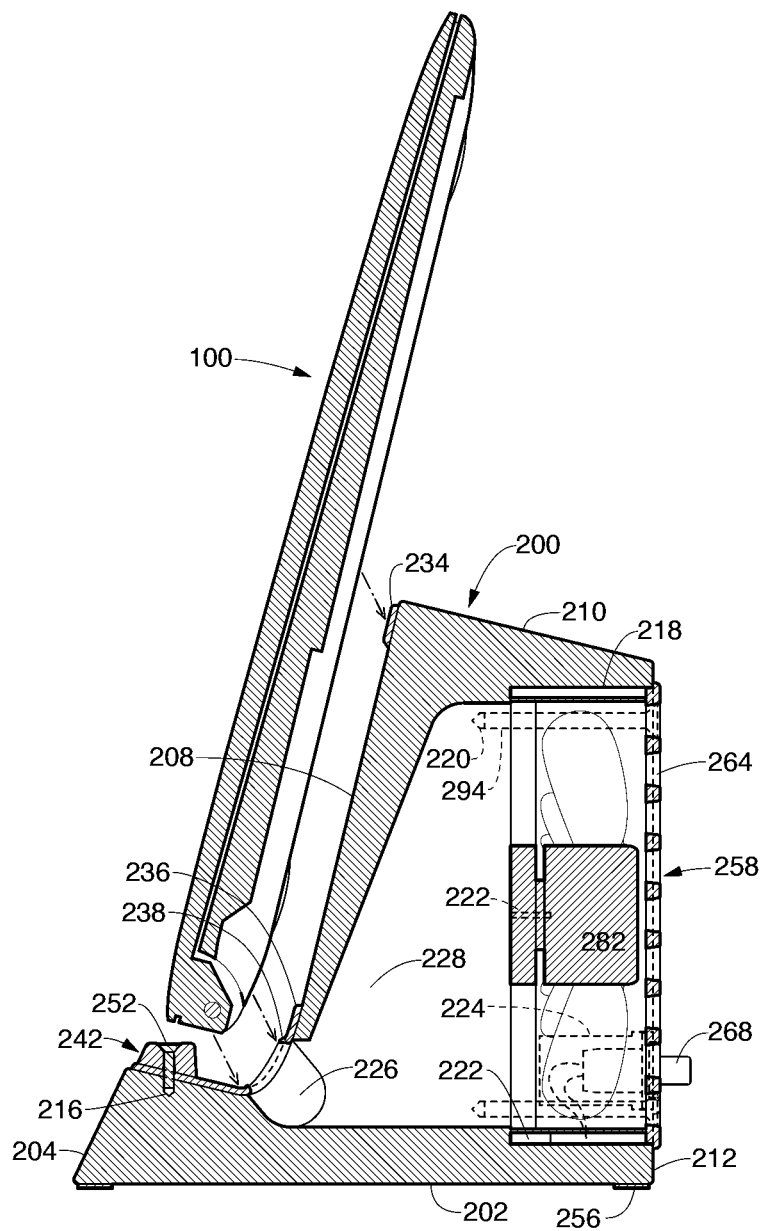
FIG. 9 illustrates an embodiment in cross-section view with example compact laptop.
Figure 10:
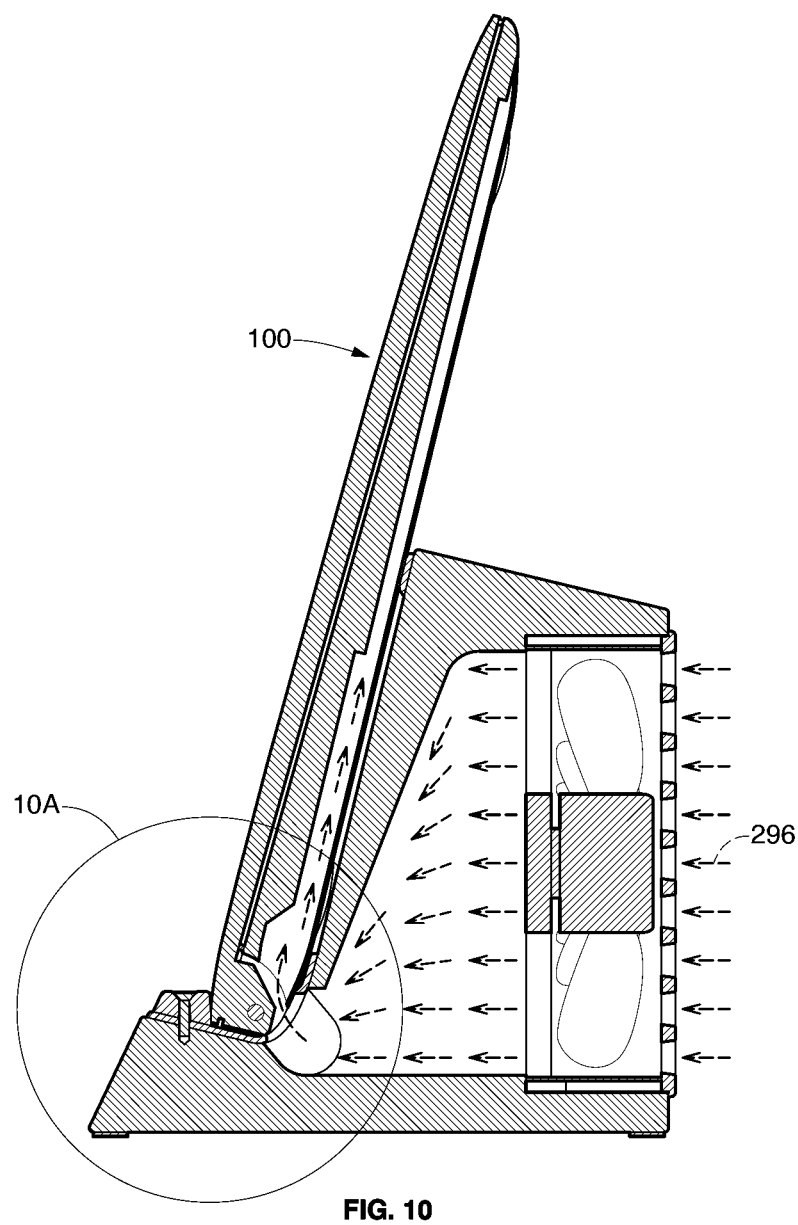
FIG. 10 illustrates an embodiment in cross-section view with example compact laptop and air movement.

An embodiment of a laptop cooling stand, dock, and support base that I presently contemplate is illustrated in FIGS. 5 to 14. The embodiment elevates, supports, and cools laptops, such as the example laptops as shown in FIGS. 1 to 4. FIG. 5 illustrates the embodiment in front top right perspective view without example laptops in place. FIG. 6 illustrates the embodiment in back top left perspective view without example laptops in place. FIG. 7 illustrates the embodiment in exploded assembly view without example laptops in place. FIG. 8 illustrates the embodiment in top view without example laptops in place. FIG. 9 illustrates the embodiment in cross-section view with example compact laptop. FIG. 10 illustrates the embodiment in cross-section view with example compact laptop placed in embodiment and with airflow generated by embodiment as depicted by arrows. FIG.

Figure 10A:
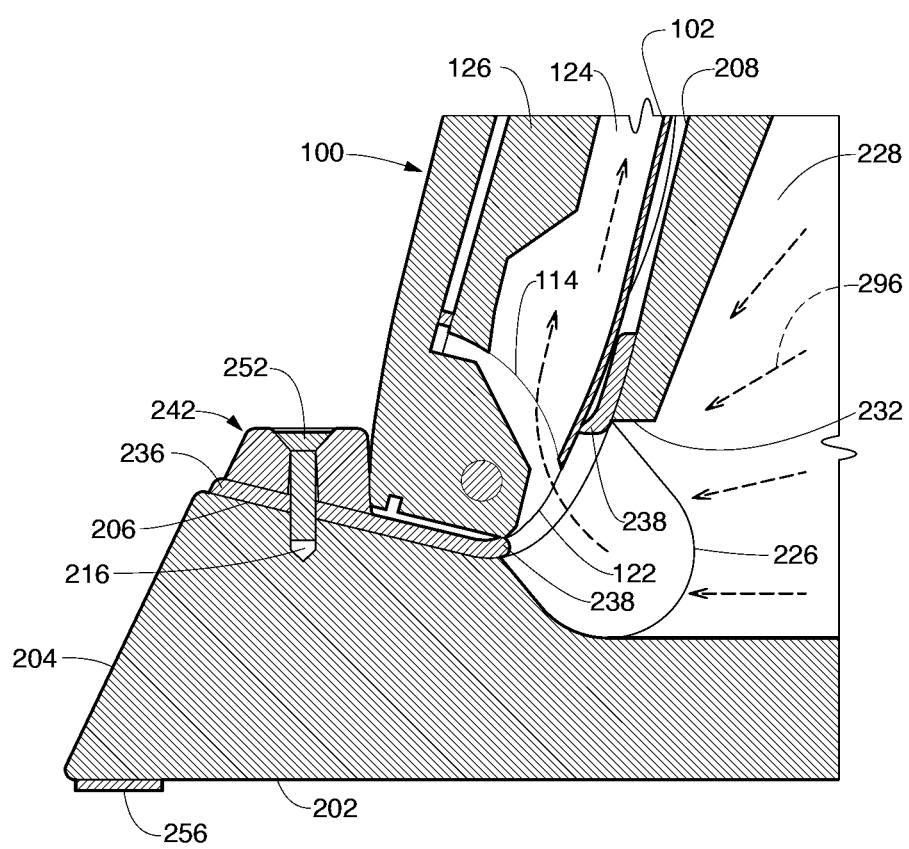
FIG. 10A illustrates an embodiment in enlarged cross-section view with example compact laptop and air movement.
Figure 11:
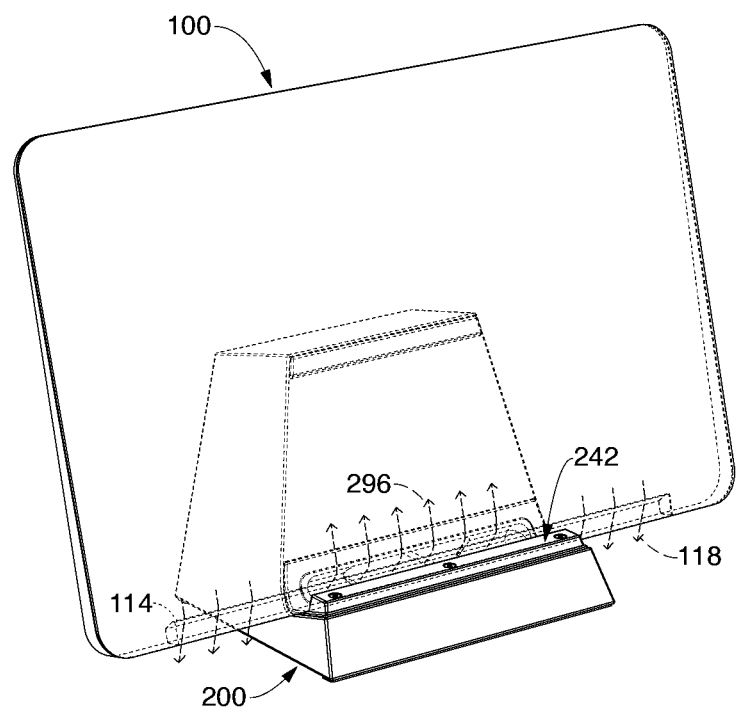
FIG. 11 illustrates an embodiment in airflow hidden/dashed line perspective view with example compact laptop.
Figure 12:
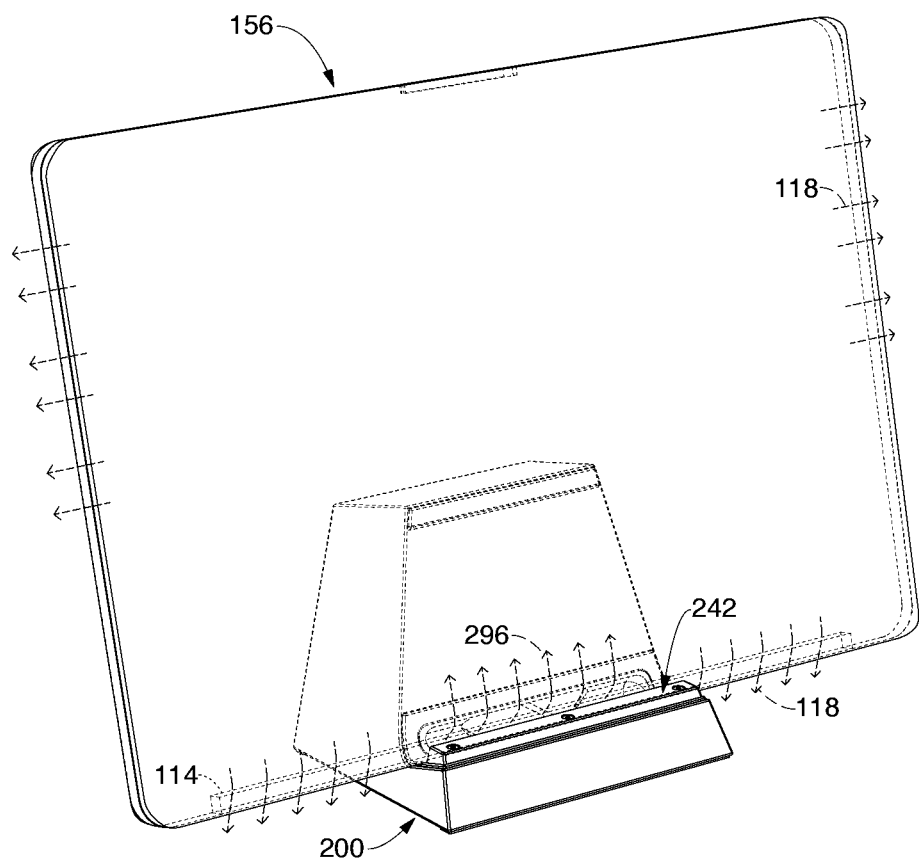
FIG. 12 illustrates an embodiment in airflow hidden/dashed line perspective view with example full-sized laptop.
Figure 13:
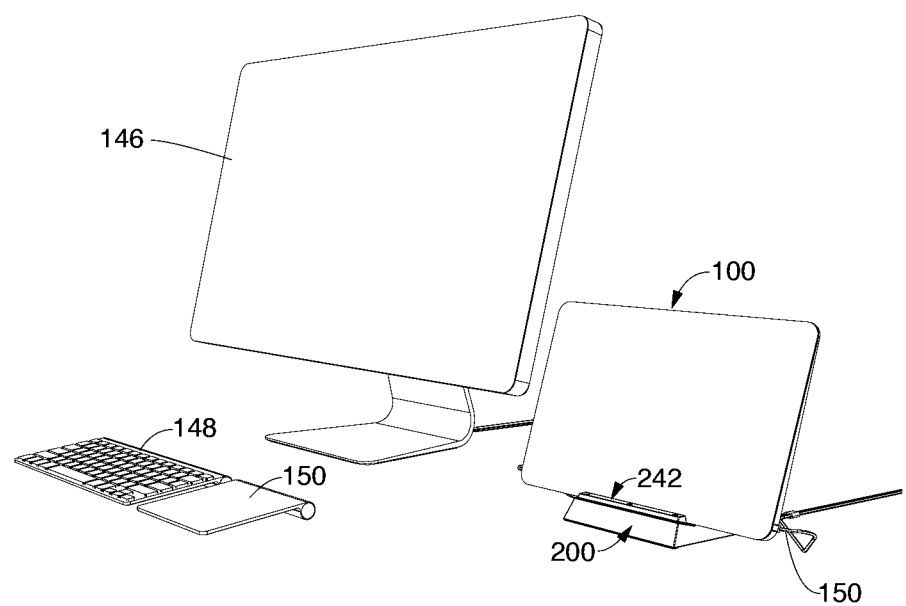
FIG. 13 illustrates an embodiment in front perspective view with example compact laptop, external monitor and external keyboard/mouse.
Figure 14:
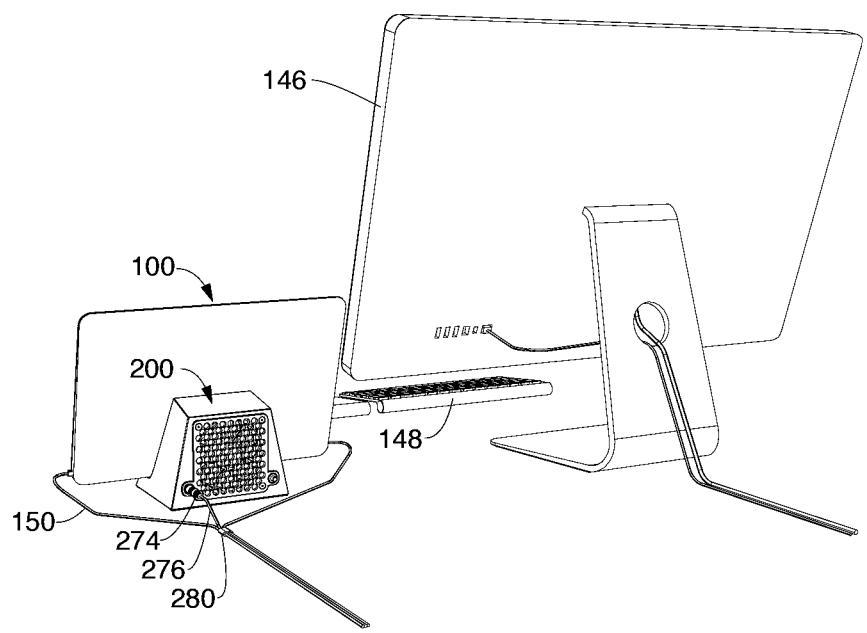
FIG. 14 illustrates an embodiment in back perspective view with example compact laptop, external monitor and external keyboard/mouse.

10A illustrates an enlargement of FIG. 10 at the laptop's and embodiment's air vent connection. FIG. 8 includes a cross-section cut reference line for FIGS. 9, 10, and 10A. FIG. 11 illustrates the embodiment in the same view as FIG. 5 but with example compact laptop in place and with airflow generated by embodiment as depicted with arrows. FIG. 12 illustrates the embodiment in the same view as FIG. 5 but with example full-sized laptop in place and with airflow generated by embodiment as depicted with arrows. FIG. 13 illustrates the embodiment in front perspective view with example compact laptop in place, laptop connected to an external monitor, keyboard, and mouse, as well as the embodiment connected to a power supply cord. FIG. 14 illustrates the embodiment in back perspective view with example compact laptop in place, laptop connected to an external monitor, keyboard, and mouse, as well as the embodiment connected to a power supply cord.

The embodiment has an aluminum laptop support cradle and air cooling unit enclosure 200. The cradle 200 has multiple faces that take on an angular and pyramidal shape with a wide rectangular base and a narrow trapezoidal top. The cradle 200 has a rectangular bottom face 202, connecting at an acute angle of around 65 degrees with a protruding trapezoidal front face 204, connecting at an obtuse angle of around 102 degrees with a trapezoidal laptop support shelf face 206, connecting with a curving inside corner at roughly a right angle to a trapezoidal laptop support back face 208, connecting at roughly a right angle to a trapezoidal top face 210, connecting at an obtuse angle or around 104 degrees to a trapezoidal vertical back side face 212, and connecting at roughly a right angle to the bottom face 202. The cradle 200 has two angled sides 214, with acute angles of around 77 degrees, resulting in the top 210 being narrower than the bottom 202. The cradle's 200 laptop support shelf 206 has a plurality of removable pad mounting holes 216. The cradle's 200 back has a square fan pocket cutout 218 with fan mounting holes 220 in each corner. The fan pocket 218 has fan alignment tabs 222 raised from interior side walls. The fan pocket 218 has two power part pocket cutouts 224 on each side. The fan pocket 218 and power part pockets 224 have round inside corners perpendicular to the back 212 and sharp ninety degree corners parallel to the back 212. The cradle 200 has a wide, deep and narrow air exhaust slot cutout 226 at the curving corner of the laptop support shelf 206 and laptop support back 208. The cradle 200 has an inner air chamber pocket cutout 228 that extends from an air intake hole 230 at the fan pocket 218 to an air exhaust hole 232 at the air exhaust slot 226. The air exhaust slot 226 and the air chamber 228 have round corners.

A top laptop support pad 234 adheres to the cradle 200 along the top edge of the laptop support back 208, leaving most of the laptop support back 208 exposed. A lower laptop support pad 236 adheres to the cradle 200 over the laptop support shelf 206, curving part way up the laptop support back 208 to cover around the air exhaust slot 226, and leaving most of the laptop support back 208 exposed. The lower pad 236 has a protruding air seal lip 238 that runs around the edge of the air exhaust slot 226. The lower laptop support pad 236 has holes 240 corresponding to the laptop support shelf's 206 pad mounting holes 216. A removable laptop support pad 242 has a flat top face 244, angled bottom 246, and four side faces 248 angled out toward the bottom 246. The bottom face 246 has an angle matching the laptop support shelf's 206 angle. The removable pad 242 has countersunk holes 250 corresponding to the laptop support shelf's 206 pad mounting holes 216. A plurality of countersunk fasteners 252 pass through countersunk holes 250 and holes 240 to thread into pad mounting holes 216 and secure the removable pad 242 to the cradle 200. The removable pad 242 can be replaced with a plurality of replacement removable pads 254 with different thicknesses. Two bottom feet pads 256 adhere to the front and the back edges of the bottom 202.

A plastic back cover and fan filter screen 258 fits into and covers the area of the fan pocket 218 and has two power part tabs 260 that fit into and over the area of the power part pockets 224. The back cover 258 slightly overlaps onto the back 212. The back cover 258 has four countersunk holes 262 corresponding to the cradle's 200 fan mounting hole 220 locations. The back cover 258 has a multitude of air holes 264 located between the countersunk holes 262 and covering the area corresponding to the fan pocket 218. The power part tabs 260 each have a power part insert hole 266 centered over each power part pocket 224. A pushbutton on/off power switch 268 inserts and snap-locks into a power part insert hole 266. A power connector jack 270 inserts into the other power part insert hole 266 and locks in place with a nut 272. A removable power connector plug 274 inserts into the power jack 270. The power connector 274 has a power cord 276 that extends to a power conversion unit with wall plug prongs 278. A cable management loop 280 with a strip of hook-and-loop material attaches around and slides up and down the power cord 276. A 12-volt direct-current case fan 282 has a two wire cable connector 284, as well as corner holes 286 corresponding to the fan mounting holes 220 and the countersunk holes 262 locations. A negative wire 288 connects from the power jack 270 to the fan 282. A positive wire segment one 290 connects the power jack 270 to the power switch 268 and a positive wire segment two 292 connects the power switch 268 to the fan 282. Tape secures negative wire 288, positive wire segment one 290, and positive wire segment two 292 onto the fan 282. Four countersunk fasteners 294 insert through the back cover's 258 countersunk holes 262 and the fan's 282 corner holes 286, and thread into fan mounting holes 220. The countersunk fasteners 294 and the fan alignment tabs 222 secure and align the fan's 282 position within the fan pocket 218.

The embodiment has sufficient width, depth, and height to provide stable support for the laptop. The cradle's 200 air exhaust slot 226 and lower pad's 236 air seal lip 238 have an opening of sufficient width and height to deliver cooling air 296 from the fan's 282 into a variety of laptop's vents 114. In addition, the cradle's 200 laptop support shelf 206 and lower pad 236 have a width sufficient for supporting a variety of laptop's without blocking the laptop's vents 114 from exhausting hot air 118, and a height sufficient to allow airflow from the laptop's vents 114. The cradle's 200 air chamber 228 has a sufficient volume and distance between the air intake hole 230 and air exhaust hole 232 to allow the fan's 282 cooling airflow 296 to reach the laptop's vent 114, instead of kicking back against the fan 282.

The removable pad 242 and replacement removable pads 254 have a variety of thicknesses sufficient to allow a variety of laptop thicknesses to press all the way down against the lower laptop pad 236 and air seal lip 238, while having sufficient tightness against the laptop, to press the laptop's vent 114 into the air seal lip 238 so that the air seal lip 238 conforms to the laptop vent's 114 and creates an air seal around the laptop vent 114. The lower laptop pad's 236 air seal lip 238 has compression and flexibility sufficient to conform around the laptop's vent 114 to create an air seal so that fan 282 driven cooling airflow 296 pushes into the laptop's air chamber 124. The top pad 234, lower pad 236, removable pad 242, and replacement removable pads 254 have sufficient thickness, compression, and flexibility to protect the laptop from damage, prevent the laptop from slipping, reduce vibration transfer, and accommodate a variety of laptop sizes and shapes.

The laptop's closed screen operation in combination with the leaned back position of the cradle's 200 laptop support shelf 206 and laptop support back 208, configures the laptop's air vent 114 so that cool airflow 296 drives through the laptop's bottom panel air slot opening 122, through the laptop's air vent 114 into the laptop's air chamber 124, instead of bypassing the laptop's air chamber 124 and exiting through the open air gap 120 created with the screen 104 in an open position. The laptop's closed screen operation allows all CPU 128 and GPU 130 resources to be dedicate to driving an external monitor 148 and provide improve visual and speed performance as compared to using the laptop's screen 104 and the laptop having to divide CPU 128 and GPU 130 resources between both the laptop's screen 104 and an external monitor 146.

The fan 282 has a size and power sufficient to drive cooling airflow 296 into the laptop's intake vent 114 while remaining sufficiently quiet for a work place setting. The fan pocket 218 has a size sufficient to house the fan 282 with sufficient space around the fan 282 for wiring. The power part pockets 224 have a size sufficient to house the power switch 290 and power jack 292. The air holes 264 have a size sufficient to allow airflow while not allowing fingers to pass through the openings.

The fan's 282 use of a 12-volt external power source and the power plug's 278 remote location from the laptop, provide the fan 282 with greater power than a 5-volt source, prevents heat generation that would result from the laptop providing 5-volt fan power, and prevents heat transfer form the power plug 278 to the laptop.

The cradle's 200 aluminum construction, including the aluminum laptop support back 208, provide a thermal heat sink to cool the laptop by absorbing heat radiating from the laptop's enclosure 100 and bottom panel 102.

The cradle's 200 air exhaust slot 226, air chamber 228, fan pocket 218, and power part pockets 224, in combination with the air seal lip 238, fan 282, wiring 288, 290, 292, power switch 268, power jack 270, power connector 274, power cord 276, and power plug 278, pull cool airflow 296 from behind the embodiment and drive cool airflow 296 through the laptop's closed screen position air vent 114, pushing cool airflow 296 over laptop's internal electronic components 126, enclosure 100, and bottom panel 102, cooling the laptop's internal electronic components 126, enclosure 100, and bottom panel 102, feeding cool airflow 296 into the one or more fans 138, increasing the fans 138 efficiency, driving waste hot exhaust airflow 118 out vents 114, driving waste hot exhaust airflow 118 out of side vents 154 if present, flushing out heat, increasing the rate of air exchanges, increasing the laptop's overall cooling capacity, reducing CPU 128 and GPU 130 heat induced performance throttling, improving overall speed, reducing heat stress on internal components, reducing internal cooling fan 138 noise and mechanical wear, allowing the laptop to run at full load, and expanding maximum cooling capabilities enough to allow for CPU 128 and GPU 130 over-clocking upgrades.

The cradle's 200 front 204, laptop support shelf 206, and laptop support back 208, in combination with the top pad 234, lower pad 236, and removable pad 242 provide an elevated and stable support for the laptop to sit and lean at an angled position that takes up less desktop space and prominently displays the laptop as an aesthetic element. The substantially upright laptop position in the embodiment displays the front face of the device, hides cable clutter and other accessories behind the laptop and embodiment, as well as, provides for viewing front facing screens in devices such as tablet conversion laptops and tablets.

The cable management loop 280 collects cables to reduce clutter and clean up workspace appearance, as well as gathering and holding cables in place for a more efficient cable to laptop connection and disconnection process.

The embodiment in combination with the laptop and external input and output accessories, such external monitors 146, external keyboards 148, external mice 150, external hard drives, external speakers and data docks/hubs, provide for improved work station ergonomics as compared with working with a laptop's screen 104, keyboard 110 and touch interface 112.

The embodiment supports and cools a variety of devices with an air vent located near one of the sides, including the example laptops shown in FIGS. 1 to 4 with an air vent 114 located along the back edge 108 at the screen hinge 106. To operate the embodiment with one of the example laptops shown in FIGS. 1 to 4 a laptop user does the following: Places the embodiment with bottom feet pads 256 onto a desktop work surface. Inserts the wall plug power plug 278 into a AC wall outlet. Inserts the removable power connector plug 274 into the power jack 270. Selects and attaches the removable pad 242 or replacement removable pad 254 sized for the laptop. Places and centers the laptop with the back edge 108 resting on the lower pad 236, the removable panel 102 leaning against the top pad 234, and the laptop's vent 114 pressed down into the air seal lip 238. Connects the laptop to the external power supply 152, the external monitor 146, along with any other accessory cable connections. Moves the cable management loop 280 into a position along the power cord 276 so that it can wrap around and neatly bundle all other accessory cords around the hook-and-loop fastener strip. Turns on the external keyboard 148, external mouse 150, external monitor 146, and any other connected accessories. Presses the embodiment's pushbutton power switch 268 to power on the fan 282. Lifts up and rests the laptop onto the removable pad's 242 top face 244. Rotates open the laptop's screen 104, powers on the laptop, closes the screen 104 and places the laptop back into the cradle 200. Use the laptop placed in the embodiment with the external monitor, keyboard, mouse, and any other accessories.

Once the laptop user is done with using the laptop in the embodiment, the user does the following: Powers down or puts the laptop into hibernation mode. Powers off other accessories. Presses the power pushbutton switch 268 to turn off the fan 282 power. The user may leave the laptop within the embodiment or proceed to remove the laptop by doing the following: Disconnects the laptop from all cords and connections. Grabs and pulls up on the laptop to extract it from the cradle 200 to store, transport or use the laptop in mobile conditions.

Figure 27:
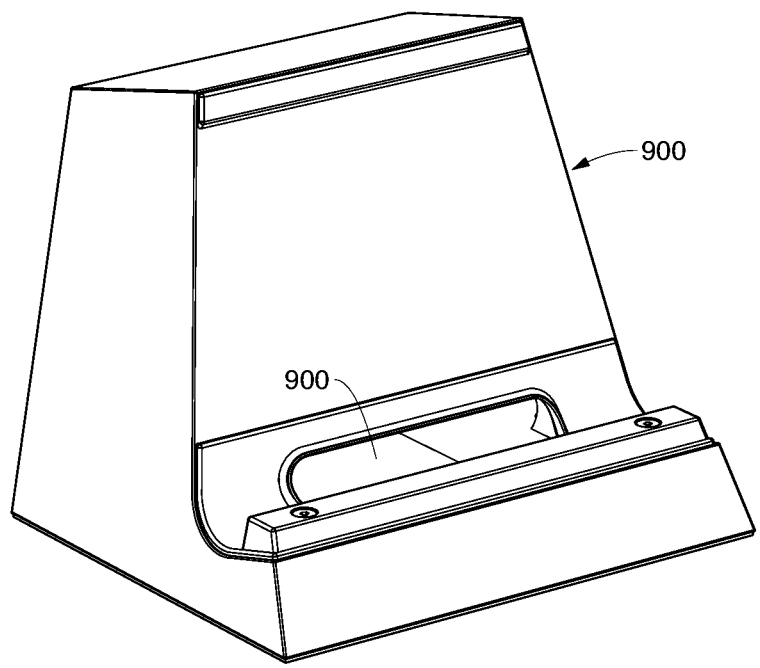
FIG. 27 illustrates an embodiment in front top right perspective view without example laptop.
Figure 28:
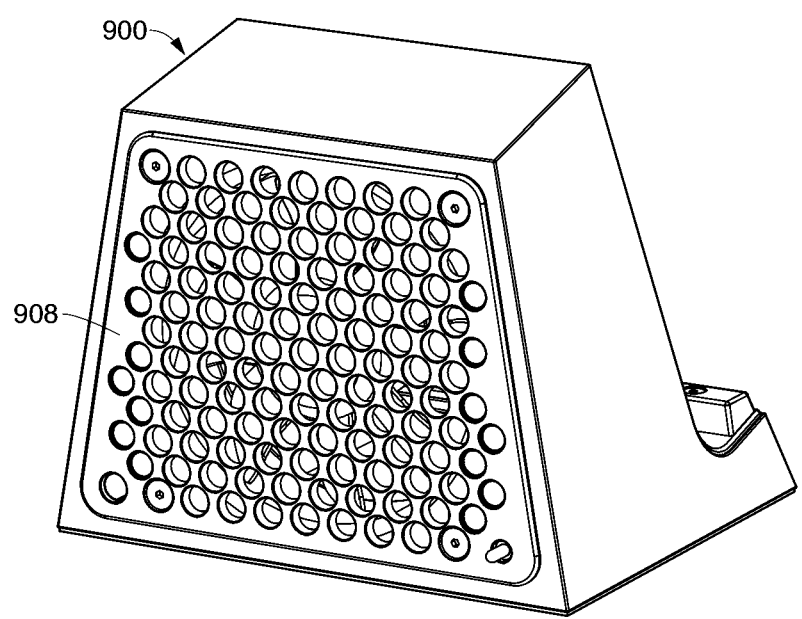
FIG. 28 illustrates an embodiment in back top left perspective view without example laptop.
Figure 29:
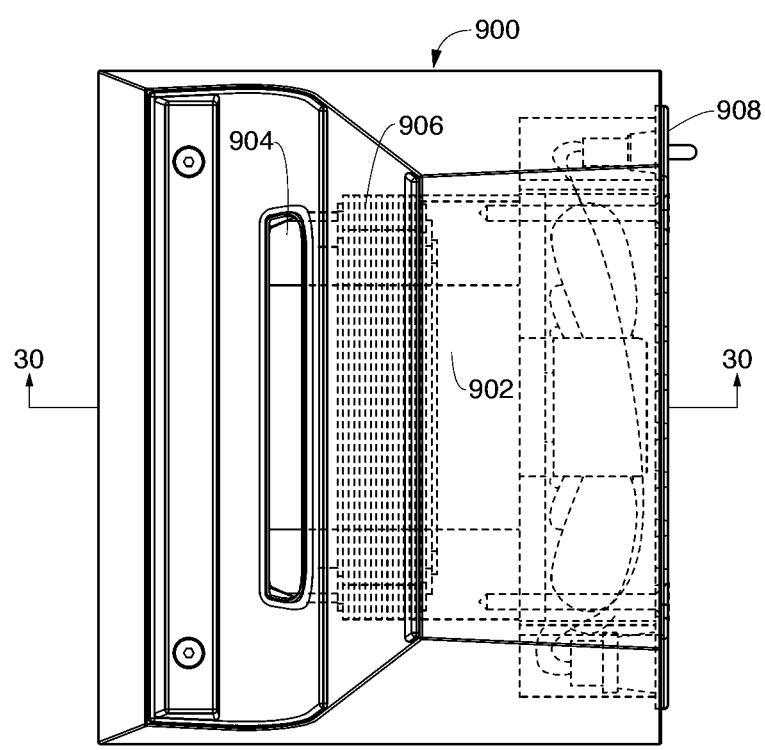
FIG. 29 illustrates an embodiment in top view without example laptop.

Additional embodiments are illustrated in FIGS. 15 to 30. The systems disclosed in these embodiments elevate, support, and cool electronic devices, such as the example laptops as shown in FIGS. 1 to 4. FIGS. 15, 17, 19, 21, 23, 25, and 29 illustrate embodiments in top view without example laptops in place. FIGS. 16, 18, 20, 22, 24, 26, and 30 illustrate embodiments in cross-section view with example compact laptop. FIGS. 27 and 28 illustrate embodiments in perspective view.

Figure 15:
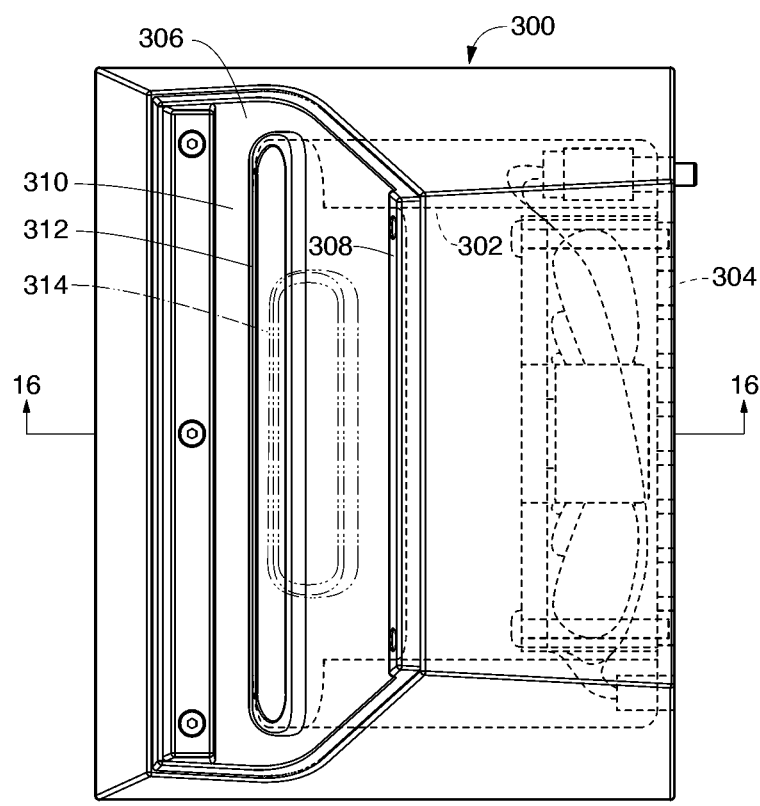
FIG. 15 illustrates an embodiment in top view without example laptop.
Figure 16:
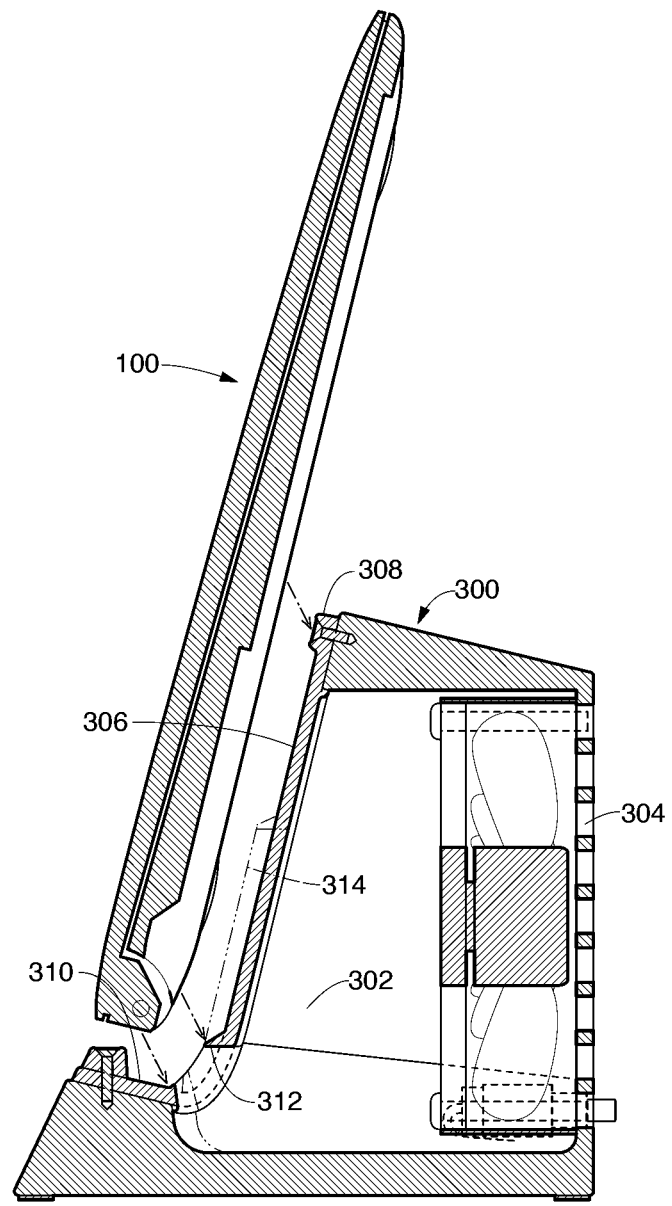
FIG. 16 illustrates an embodiment in cross-section view with example compact laptop.

FIGS. 15 and 16 illustrate an embodiment that is similar to the embodiment shown in FIGS. 5 to 14, with the following modifications:

A cradle 300 with a combined front fan and air chamber pocket cutout 302. The cradle 300 back has a multitude of air holes 304. A plastic front cover 306 has integral top pad 308, an integrated lower pad 310, and an integral air seal lip 312. The plastic front cover 306 can be removed and replaced with a different plastic cover that has a different shaped and sized air seal lip 314 to match up with a device's different shaped and sized air vent. The fan 282, power switch 268, and power jack 270 insert into the combined front fan and air chamber pocket cutout 302 and attach to holes in the cradle 300.

Figure 17:
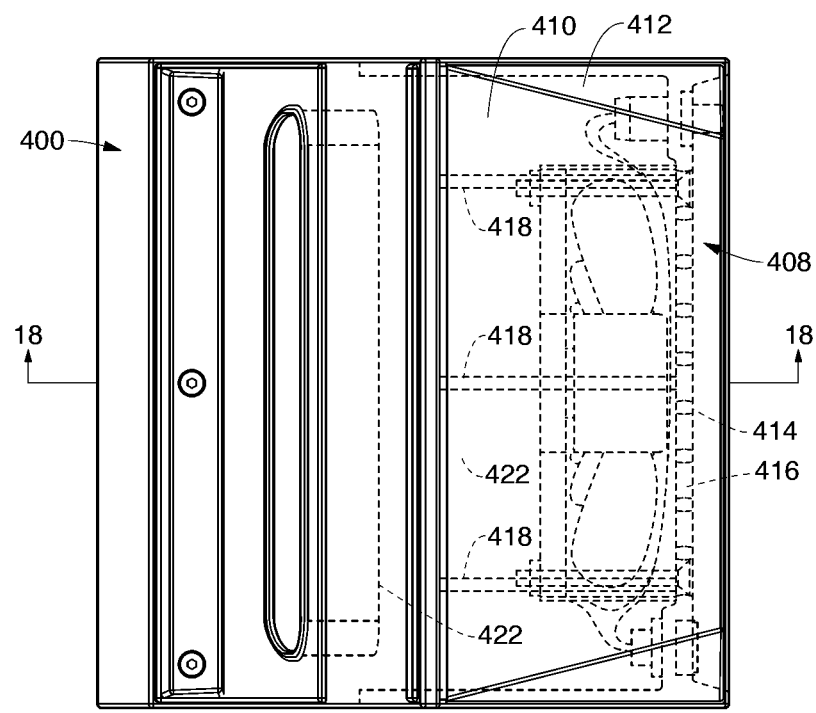
FIG. 17 illustrates an embodiment in top view without example laptop.
Figure 18:
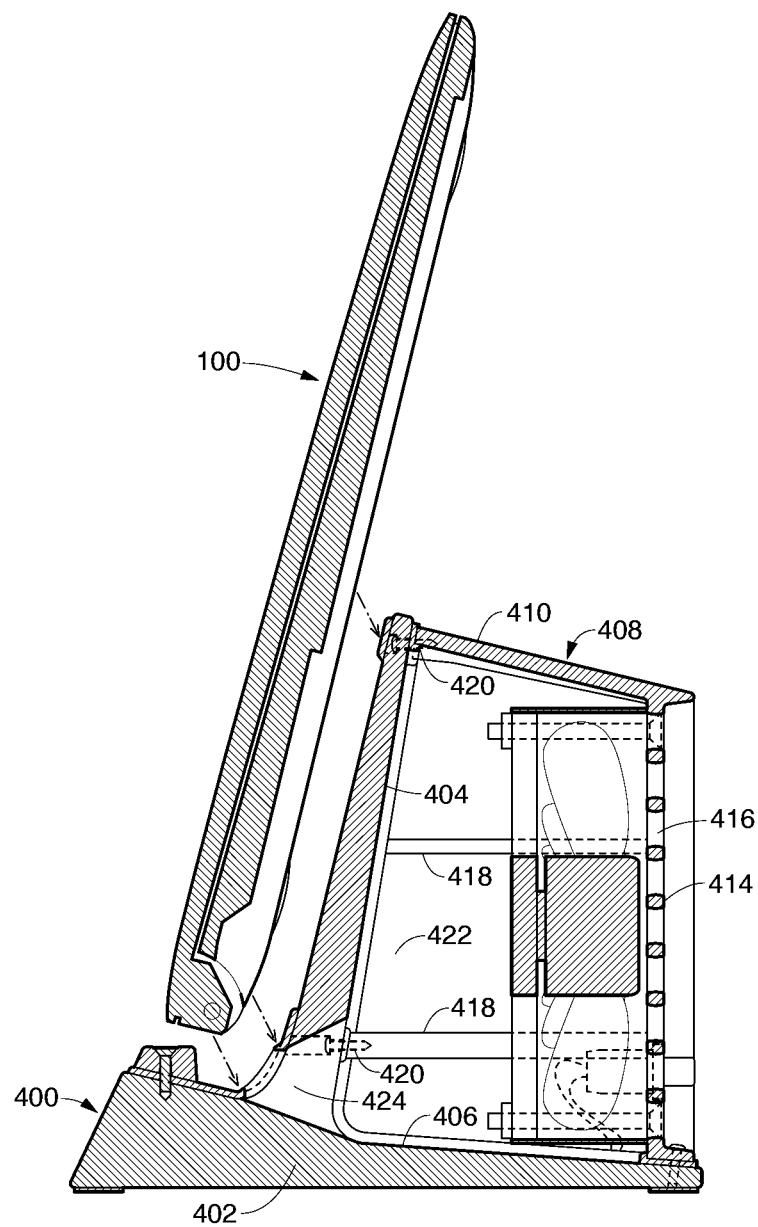
FIG. 18 illustrates an embodiment in cross-section view with example compact laptop.

FIGS. 17 and 18 illustrate an embodiment that is similar to the embodiment shown in FIGS. 5 to 14, with the following modifications:

The cradle 400 has straight sides with a "L" shape side profile and cross section 402 with an angled upper backside face 404 and an angled lower backside face 406 connecting at a curving inside corner with an air exhaust slot cutout 424. A hollow plastic enclosure back cover 408 has a solid angled top 410, solid angled sides 412, and a recessed vertical back 414 with a multitude of air holes 416. The back cover's 408 inside has a multitude of stiffening ribs 418 running from front to back. The fan 282, power switch 268, and power jack 270 attach through holes from the inside face of the back cover's 408 back 414. A plurality of fasteners 420 attach the back cover 408 to the cradle's 400 upper backside 404 and lower backside 406, creating an enclosed an air chamber 422. The back cover 408 has sufficient wall thickness to create a ridge enclosure when attached to the cradle 400.

Figure 19:
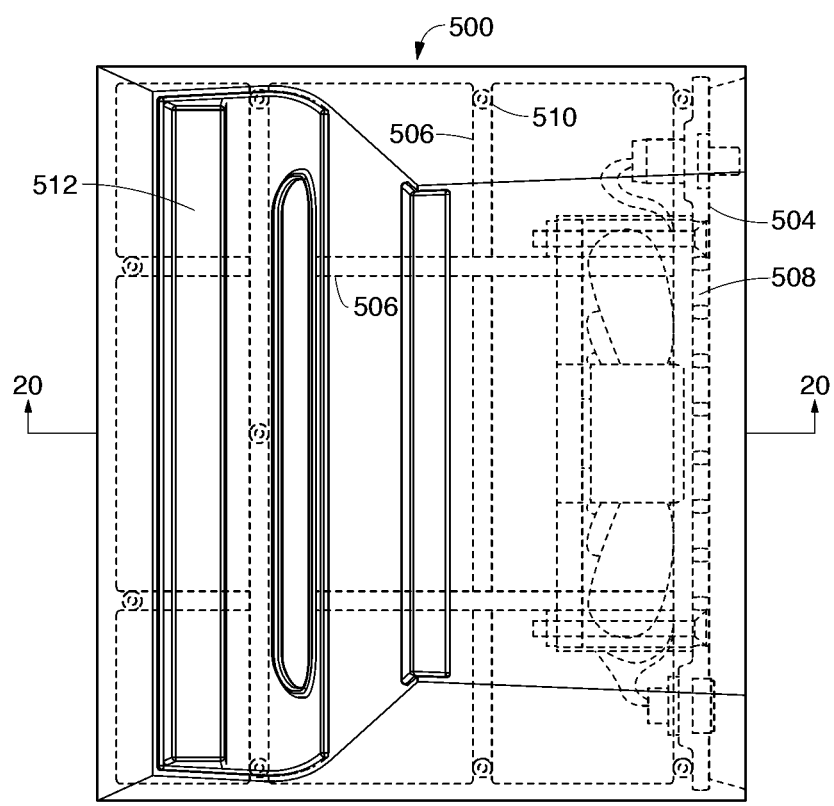
FIG. 19 illustrates an embodiment in top view without example laptop.
Figure 20:
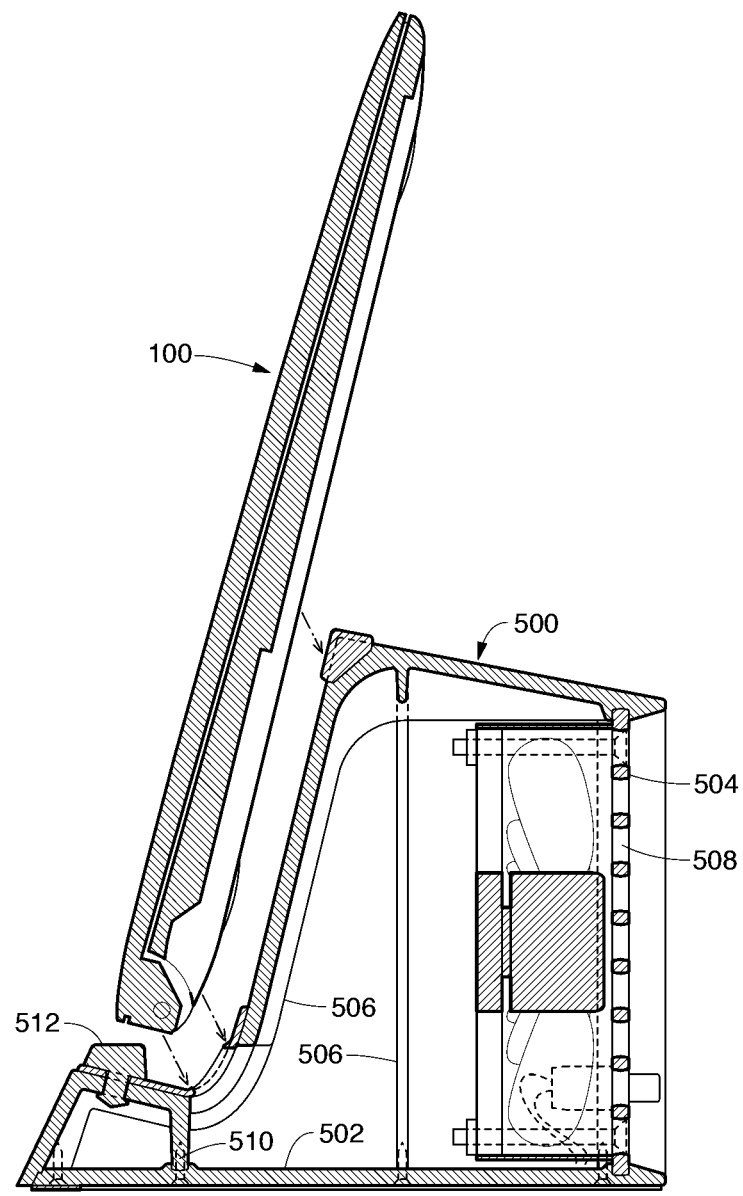
FIG. 20 illustrates an embodiment in cross-section view with example compact laptop.

FIGS. 19 and 20 illustrate an embodiment that is similar to the embodiment shown in FIGS. 5 to 14, with the following modifications:

An open bottom and open back plastic hollow cradle 500 covered by a plastic bottom cover panel 502 and covered by a plastic back cover panel 504. The cradle's 500 inside has a multitude of stiffening ribs 506 running from front to back and from side to side. The back cover 504 has a multitude of air holes 508. The fan 282, power switch 268, and power jack 270 attach through holes from the inside face of the back cover 504. The back cover 504 slides into slot channels on the inside of the cradle 500. A plurality of fasteners 510 attach the bottom cover 502 to the cradle's 500 bottom edges. A snap-in insert removable pad 512 attaches to the cradle 500. The cradle 500, bottom cover 502 and back cover 504 have sufficient wall thickness to create a ridge enclosure and laptop support when attached together.

Figure 21:
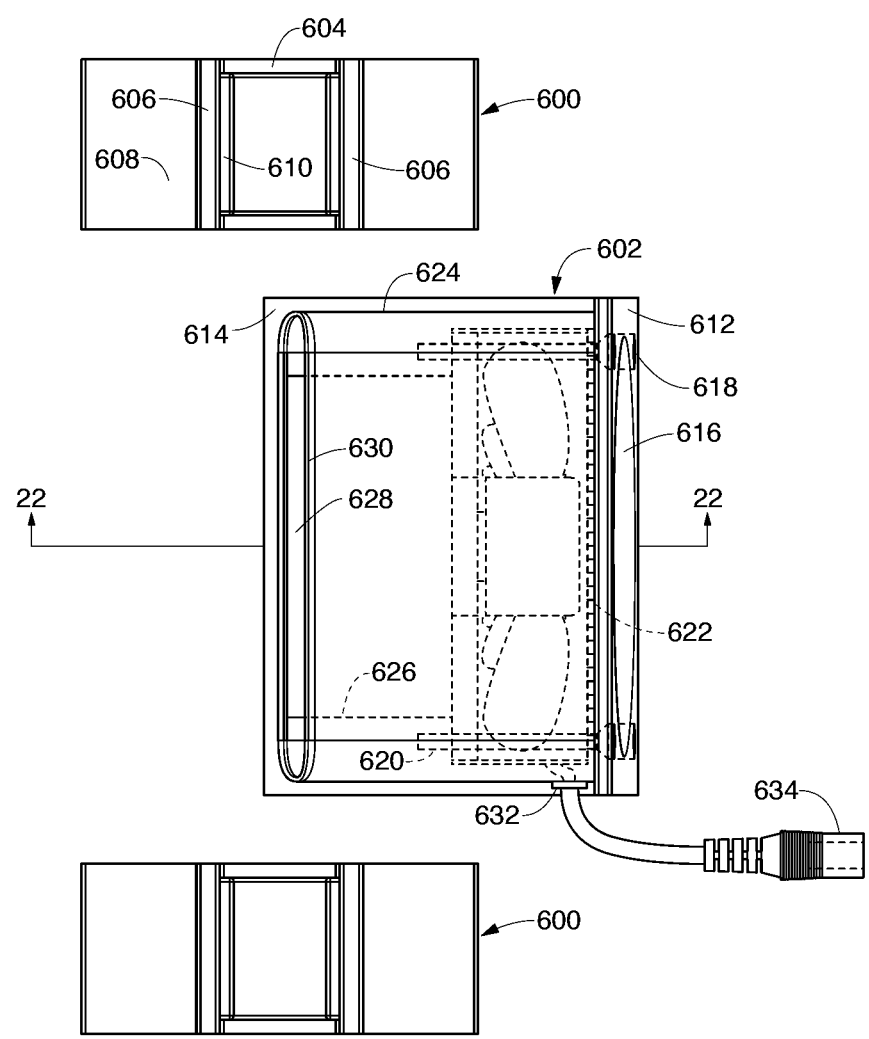
FIG. 21 illustrates an embodiment in top view without example laptop.
Figure 22:
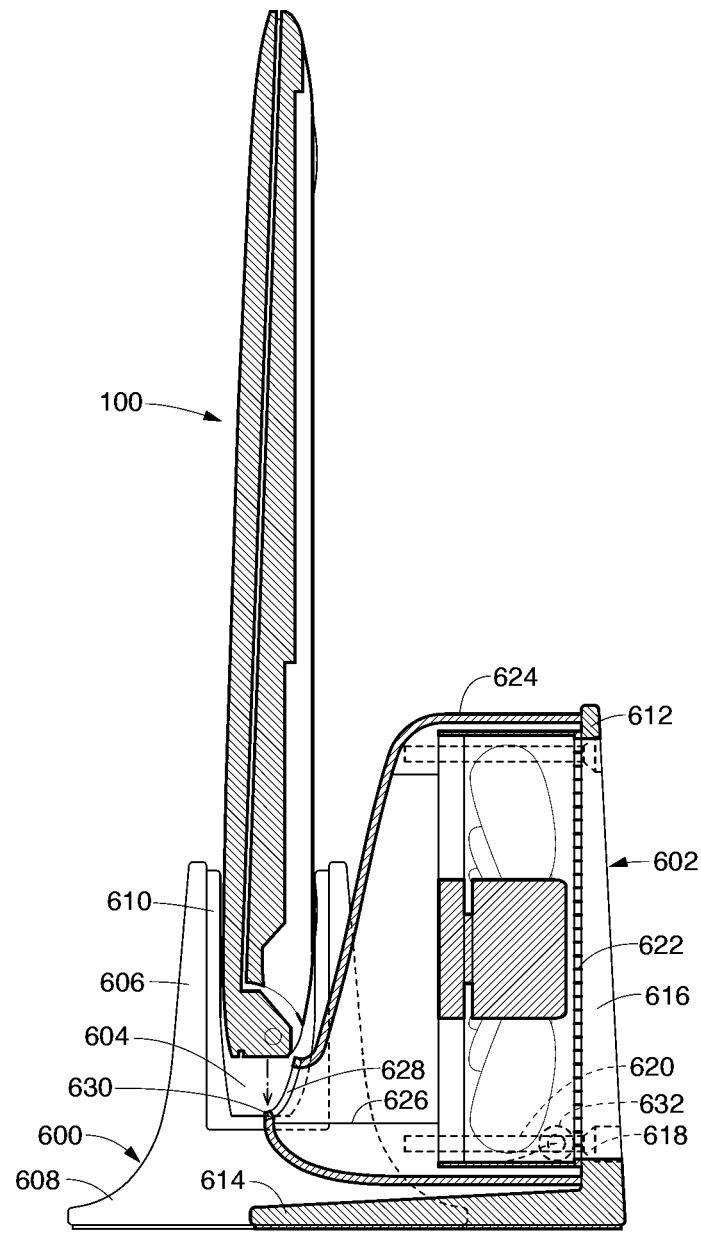
FIG. 22 illustrates an embodiment in cross-section view with example compact laptop.

FIGS. 21 and 22 illustrate an embodiment that is similar to the embodiment shown in FIGS. 5 to 14, with the following modifications:

The embodiment has two separate laptop supports 600 and a laptop cooling unit 602. The separate laptop support units 600 have an aluminum frame with a laptop support slot 604 in the middle of two vertical arms 606 with outside faces that curve and slope to a base 608. A replaceable "U" shaped laptop support pad 610 attaches to the inside of the laptop support slot 604. The two separate laptop supports 600 are positioned so that the laptop sits upright and vertically within the laptop support slot 604 of the two laptop supports 600 without blocking the laptop's air vent 114. The two laptop supports 600 have a height sufficient to prevent the laptop from rotating forward or backward. The two laptop supports 600 have a depth sufficient to prevent the laptop and the two laptop supports 600 from rotating forward or backward. The two laptop supports 600 have a width sufficient to prevent side overturning but narrow enough to fit under the laptop's back edge without blocking the laptop's air vent 114. The two laptop support slots 600 has an opening width, when combined with the support pads 610, sufficient to accept a variety of laptop thicknesses.

The laptop cooling unit 602 has an aluminum vertical fan support arm 612 that turns at roughly a right angle to form a horizontal base 614. The vertical arm 612 and horizontal base 614 have thicknesses that tapper from thicker at their meeting to thinner at their ends. The vertical arm 612 has a single air hole 616 in the center and four fan mounting holes 618 in the corners. Four fasteners 620 pass through the fan mounting holes 618 to connect the fan 282, an air filter screen 622, and a hollow plastic air funnel and fan enclosure 624 to the vertical arm 612. The plastic air funnel enclosure 624 covers over the fan 282 and has corner bosses with threaded holes 626 into which the fasteners 620 thread. The plastic air funnel enclosure 624 slopes and angles down and away from the fan 282 to a slot opening 628 with a replaceable air seal lip 630. The air seal lip 630 fits under the laptop's back edge 108 and creates an air seal connection around the laptop's air vent 114. The air seal lip 630 can be removed and replaced with a variety of air seal lip sizes and configurations to accommodate a variety of laptop air vent sizes and configurations. The plastic air funnel has a power grommet 632 with wiring that connects to the fan 282 at one end and an in-line power jack connection 634 at the other end. The vertical arm 612 and horizontal base 614 have a width, height and length sufficient for supporting the fan 282, and the laptop through the air seal lip 630 and plastic air funnel enclosure 624. The plastic air funnel enclosure 624 has sufficient wall thickness to support the laptop. The two laptop supports 600 and cooling unit 602 may move independently to align with the laptop's air vent 114.

Figure 23:
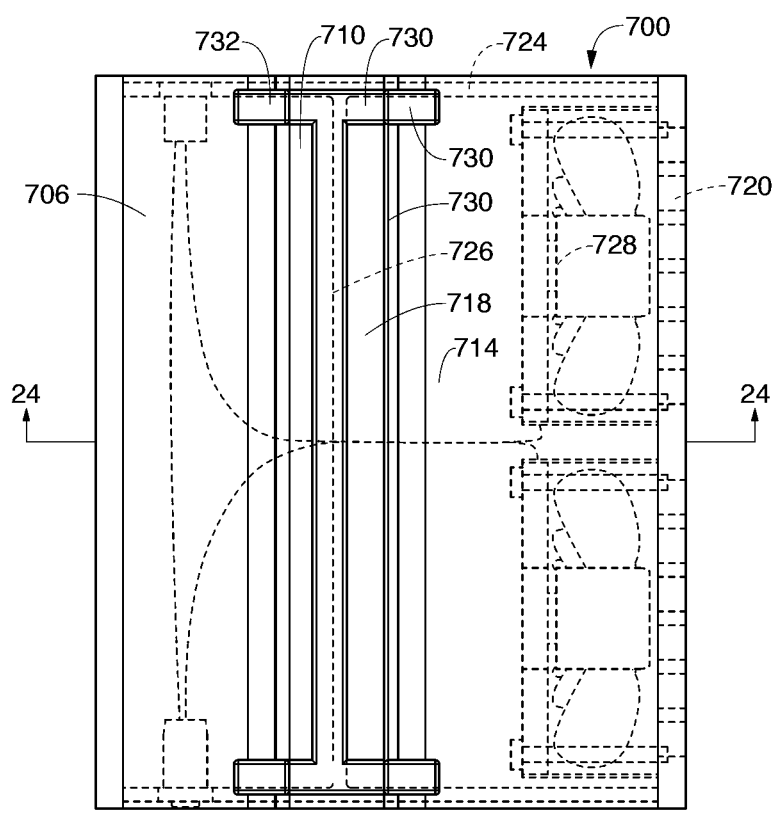
FIG. 23 illustrates an embodiment in top view without example laptop.
Figure 24:
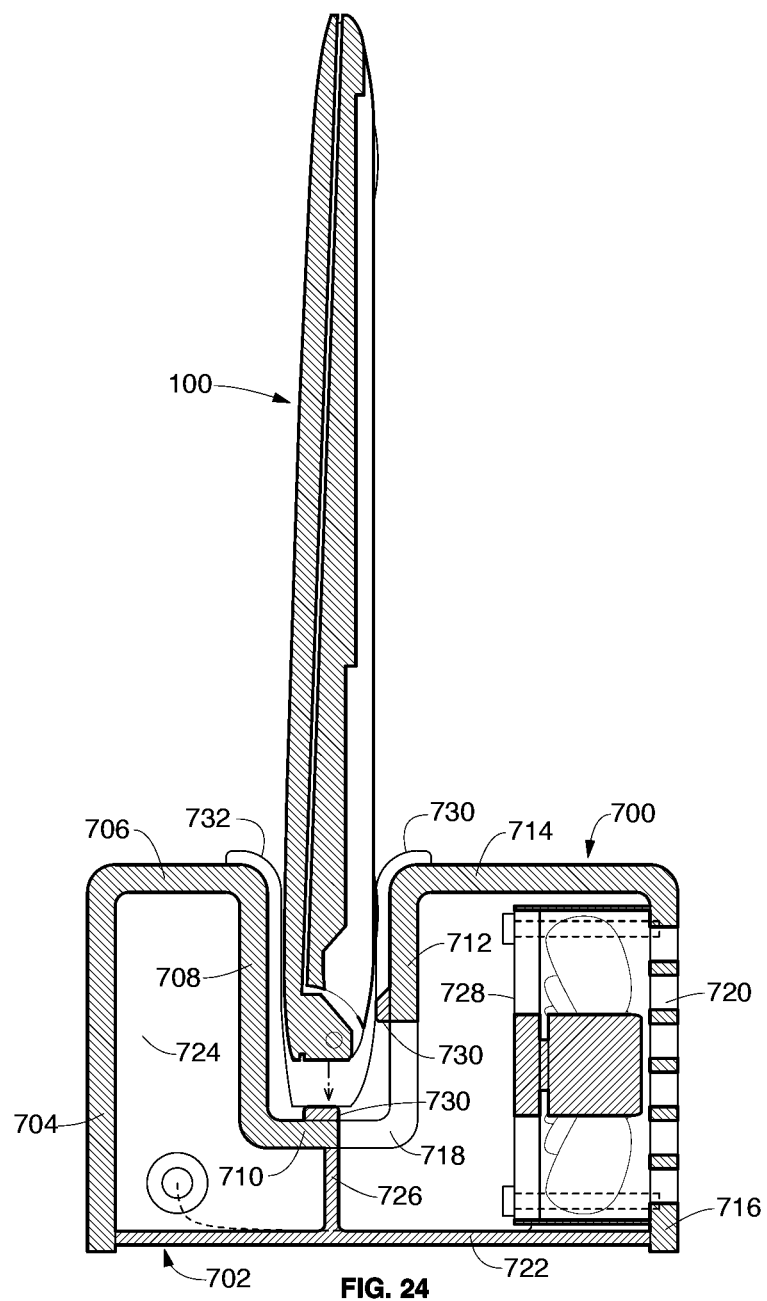
FIG. 24 illustrates an embodiment in cross-section view with example compact laptop.

FIGS. 23 and 24 illustrate an embodiment that is similar to the embodiment shown in FIGS. 5 to 14, with the following modifications:

The embodiment has a rectangular "brick" shape with an aluminum cradle 700 and plastic bottom and side enclosure cover 702. The cradle 700 has a "M" shaped side and cross-sectional profile with a front vertical member 704, continuing at a right angle to a front top horizontal member 706, continuing at a right angle to a laptop slot front vertical member 708, continuing at a right angle to a laptop slot bottom horizontal member 710, continuing at a right angle to a laptop slot back vertical member 712, continuing at a right angle to a back top horizontal member 714, and continuing at a right angle to a back vertical member 716. The laptop slot bottom horizontal member 710 and laptop slot back vertical member 712 have an airflow opening 718. The back vertical member 716 has a multitude of air holes 720. The plastic bottom and side enclosure cover 702 has a horizontal bottom panel 722 connected to two vertical sides 724 at both ends, with a vertical air chamber wall 726 running along the bottom panel's 722 top surface and connecting to the side's 724 inside surface. The sides 724 have a cutout along the top end to fit within the cradle's 700 "M" shape. The top of the air chamber wall 726 snaps into the bottom surface of the cradle's 700 laptop slot bottom horizontal member 710, along the edge of the airflow opening 718. Two smaller case fans 728 sit side by side and attach to threaded holes in the inside face of the back vertical member 716. The fan power switch 268 and power jack 270 attach to the sides 726 of the plastic bottom and side enclosure cover 702. The plastic bottom and side enclosure cover 702 slides up into and attaches to the cradle 700 with snap-in inserts. A laptop protection and air seal pad 730 attaches to laptop slot bottom horizontal member 710 and laptop slot back vertical member 712, with a removable laptop support pad 732 attached to the laptop slot front vertical member 708. The embodiment has a sufficient size and strength to support the laptop in a straight vertical position.

Figure 25:
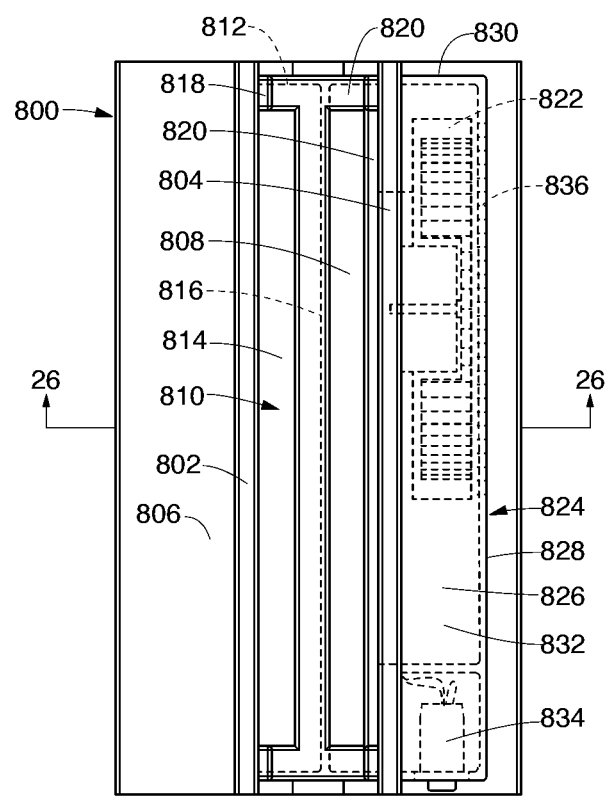
FIG. 25 illustrates an embodiment in top view without example laptop.
Figure 26:
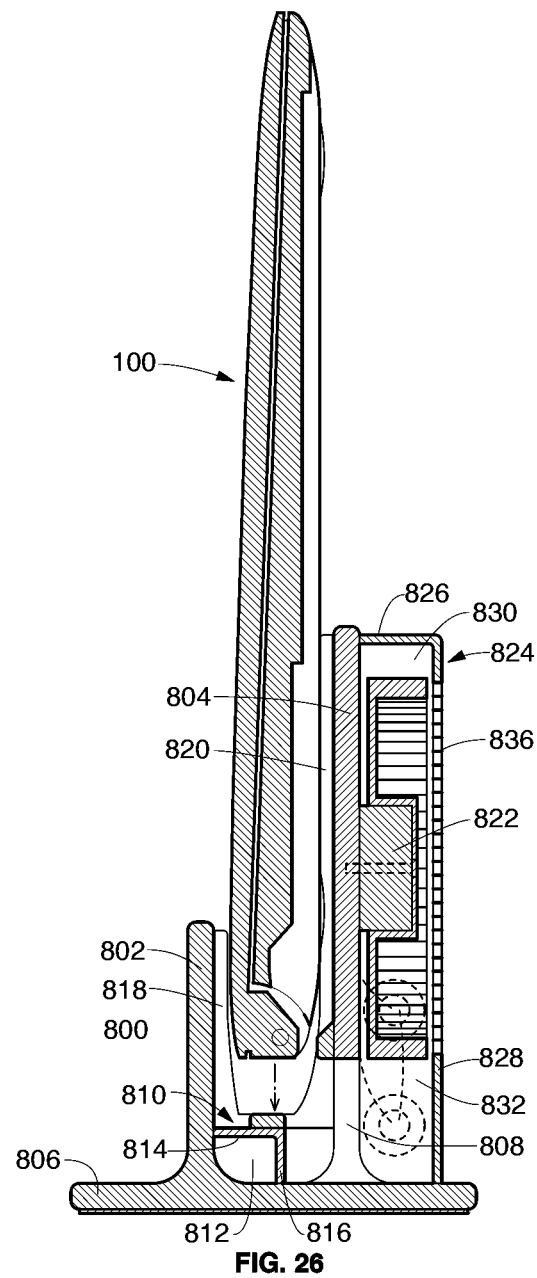
FIG. 26 illustrates an embodiment in cross-section view with example compact laptop.

FIGS. 25 and 26 illustrate an embodiment that is similar to the embodiment shown in FIGS. 5 to 14, with the following modifications:

The embodiment has an aluminum laptop support cradle 800 with a short front vertical laptop support arm 802 and a tall back vertical laptop support arm 804, both connected to a horizontal base 806 that extends forward of the front arm 802 and backward of the back arm 804. The back arm 804 has an air slot 808 cut at the bottom edge, along the base 806. A plastic laptop support shelf 810 attaches to the base 806 between the front arm 802 and the back arm 804. The laptop support shelf 810 has two side panels 812 that span from the front arm 802 to the back arm 804, and a partial top panel 814 and vertical panel 816. A removable laptop support pad 818 attaches to the inside face of the front arm 802. A fixed laptop support and air seal pad 820 attaches to the inside face of the back arm 804 and to the laptop support shelf 810. A blower fan 822 with air flow that exhausts perpendicular to the fan motor axis and air intake air flow direction, attaches to the backside face of the back arm 804. A plastic fan cover and enclosure 824 attaches to the backside face of the back arm 804. The enclosure 824 has a top panel 826, back panel 828 and two side panels 830 that enclose an air chamber 832. The enclosure 824 has interior walls that funnel and direct exhaust air toward the air chamber 832, and walls that create a separate power part chamber 834. The back panel 828 has a multitude of air holes 836 located at the fan 822 intake. The side panel 830 along the power part chamber 834 has holes for the power switch 268 and power jack 270 to attach. The fan 822 pulls air through the air holes 836, pushes air into the air chamber 832, through the air slot 808, past the laptop shelf's 810 vertical panel 816 and into the laptop's vent 114. The embodiment has a sufficient size and strength to support the laptop in a straight vertical position.

Figure 30:
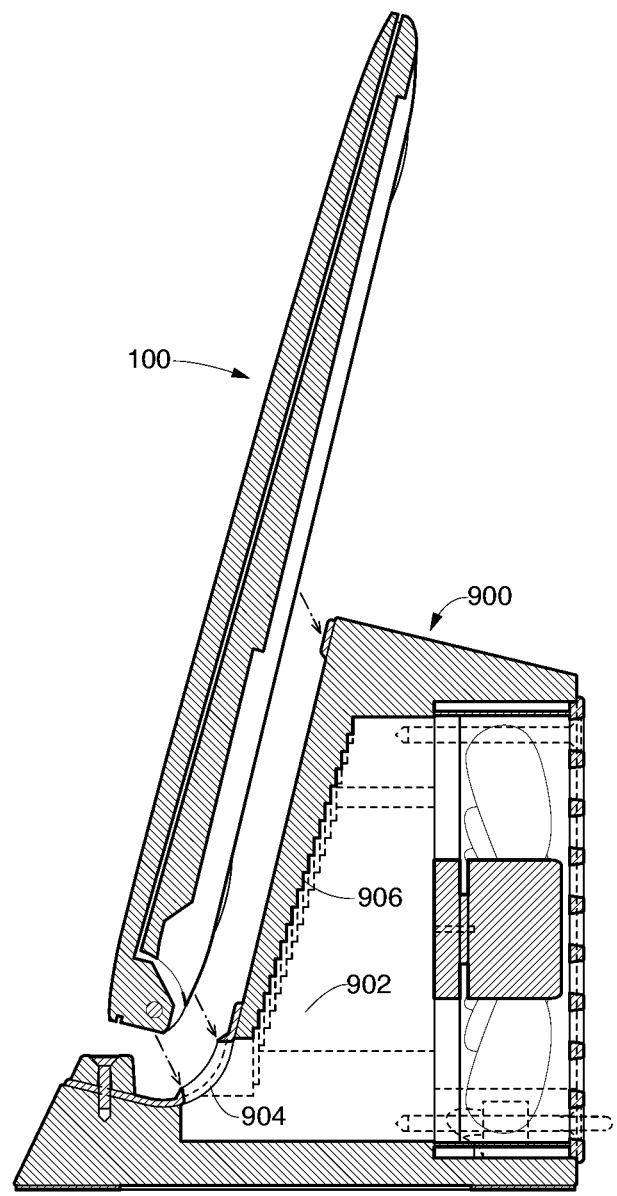
FIG. 30 illustrates an embodiment in cross-section view with example compact laptop.

FIGS. 27 and 30 illustrate an embodiment that is similar to the embodiment shown in FIGS. 5 to 14, with the following modifications:

A cradle 900 with an air chamber 902 that connects directly with an air exhaust hole 904. The air chamber 902 has a back wall 906 with stepping machined surface. A plastic back cover and fan filter screen 908 has angles sides.

MODIFICATIONS TO THE EMBODIMENTS

While the above embodiment descriptions contain many specifications, these should not be construed as limitations on the scope, but rather as an exemplification of several embodiments thereof. Many other variations are possible, such as the following exemplary modifications.

Various electronic devices can be supported and cooled in the manners described herein. For example, electronic devices include a variety of sizes and configurations, such as laptops, tablet conversion laptops, and tablets. Laptop's compatible with the embodiments include laptops with a variety of air vent configurations, such as vent size, shape and location, as well as vents that push out hot air or pull in cool air. For example, the air vent could be located along the back edge or located along the back surface. Internal air movement can be driven by a built-in cooling fan or by air movement created by hot air that rises and cool air that sinks. The fan air directions described herein can be modified to match the laptop vent direction, such as pushing air or pulling air. The laptop's position on the embodiment can vary, such as a fixed vertical, fixed horizontal, fixed angled, or adjustable position. For example, the device support angle and position can be adjusted with padding of different thicknesses or sliding pads. Devices with a front facing display screen, such as laptops with dual outside face and inside face screens, tablet conversion laptops, and tablets, can be supported for viewing, as well as touching the screen for touch screen displays.

The laptop support cradle and fan enclosures described herein can be made from a variety of materials, such as metal, concrete, stone, wood, composites, and plastic. The cradle can be made by a variety of manufacturing processes, such as extrusion, CNC milling, die-cast, sheet metal, and injection molding. The cradle can have a variety of finishes, such as smooth, textured, ridges, and cooling fins.

The attachment of parts described herein can be achieved in various manners. For example, attachment of parts can be achieved using adhesives, mechanical threaded fasteners with nuts, threaded holes, embedded threaded inserts, snap connections, friction inserts, slide-in inserts, twist and lock inserts, and integral manufacturing techniques that bond parts during fabrication.

The padding described herein can include a variety of materials, such as plastic, rubber, leather, and micro-suction materials. The padding can be fixed, adjustable or removable. Variation in padding thickness can be achieved through a variety of techniques, such as using pads with different thicknesses, using a single pad with a significant range of compression adjustment, using a single pad with a slot countersunk hole for front to back sliding adjustment, and using a single spring activated pad that pushes toward the laptop. The air seal padding can use a variety of techniques to provide an air seal with the laptop vent, such as using a sufficiently soft and compressible material, using a raised solid edge that cantilevers past underlying support material to enable rotational movement, using a hollowed out raised edge, using a folded back edge that rolls outward with pressure, using a single edge or a multitude of edges placed side by side as with a wave pattern, and using a material with micro-suction. The air seal padding can have a variety of shapes to match a device's air vent configurations, such as a long and narrow slot, square hole, vertical slot, or a plurality of openings.

The air chambers described herein can facilitate airflow between the fan and laptop through a variety of techniques, such as using a pressure air chamber to store cool air pushed in by fan and then driven into laptop vent, using a funneled air chamber to guide fan driven air directly at laptop vent, and using an air chamber that throttles down from the fan to the laptop vent at a rate as to not restrict the fan's ability to pull air from the laptop vent.

The fans described herein can have a variety of configurations, such as a smaller or larger size, thinner or thicker size, one or more in quantity, frames with four corner mounting or frameless with center mounting, exhaust airflow parallel or perpendicular to intake airflow, airflow in a push or pull direction, made of plastic or other material, with or without LED lights, with or without built-in speed control, with a variety of electrical connection types, and with a variety of power and performance specifications. Fan covers can have a variety of configurations, such as integrated into fan enclosure or added as a separate component, with or without an air filter, with a variety of hole or slot patterns, and made from a variety of materials.

The fan and power parts described herein can have a variety of configurations, with or without speed control, with a manual or automatic speed control, with a pressure or temperature triggered speed control, with or without a manual power switch integrated into embodiment, with or without a manual power switch integrated into power cord, with a power cord hard wired into embodiment enclosure, with a power switch located at the back or other side of the embodiment enclosure, with a power converter located external to the embodiment or integrated within the embodiment enclosure, with a USB or wall outlet power converter, and with a push-button or other switch type actuation. Example fan and power part configurations include a slow-speed fan powered directly through a wall plug, a slow-speed fan controlled with an on/off switch connected to a wall plug, a high-speed fan with two speed control switch connected to a wall plug, and a high-speed fan with variable speed control connected to a wall plug.

Cable management associated with the systems and methods described herein can include a variety of cable bundling and organization techniques, such as using a separate component or integrated into embodiment, and using cable bundling parts with fixed or adjustable locations. The cable management component can remain in place with a variety of techniques, such as using suction cups, adhesive, screws, or heavy mass. In addition to cable management, a security locking feature, USB expansion port, docking station, and hard drives can be included.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. I therefore claim as our invention all that comes within the scope and spirit of these claims.

I claim:

1. An apparatus for supporting and cooling an electronic device with at least one air vent on a vent area of the electronic device, the apparatus comprising:
    a housing with side walls, a front wall, a rear wall, and an internal area between the side walls, the front and rear walls, the rear wall having one or more openings to permit air to pass through the rear wall;
    a fan member positioned in the internal area and configured to cause air to pass through the one or more openings in the rear wall; and
    a support cradle extending beyond the front wall of the housing to receive an edge of the electronic device on a top surface of the support cradle, the top surface of the support cradle comprising at least one air exchange opening to allow air to pass through the top surface of the cradle,
    wherein the top surface of the support cradle rises above a bottom surface of the apparatus,
    wherein the top surface of the support cradle comprises a lower support pad with one or more openings aligned with the at least one air exchange opening,
    wherein the lower pad comprises one or more air seals that extend outward from the top surface of the lower pad to engage with the electronic device in the vicinity of the at least one air vent and restrict air movement between the support cradle and the electronic device at the location of the one or more air seals,
    wherein the one or more air seal extends substantially along width of the lower pad and support cradle to restrict air flow from passing between the electronic device and support cradle so that all of the air from the fan is delivered through the air exchange opening to the electronic device, and
    wherein one or more front pads extending vertically from a front portion of support cradle, the one or more front pads being configured to adjust position to engage with the electronic device to restrict movement of the electronic device away from the one or more air seals.

2. The apparatus of claim 1, wherein the one or more air seals are formed of a material that is capable of conforming to the external shape of the electronic device at the area of contact to create a seal at the area of contact.

3. The apparatus of claim 1, wherein the fan member is arranged substantially vertically within the internal area, such that the operation of the fan will cause air to move in a direction that is generally perpendicular to the rear wall.

4. The apparatus of claim 3, wherein the fan member is mounted in the internal area adjacent the rear wall.

5. The apparatus of claim 1, wherein the front pad is readily configured with adjustable sliding position or removable from the support cradle.

6. The apparatus of claim 1, wherein the front wall extends upwards from the support cradle to support a side of the electronic device when the electronic device is positioned on the support cradle.

7. The apparatus of claim 6, wherein the front wall extends upwards at an angle greater than 90 degrees and less than 135 degrees relative to the bottom surface of the apparatus to cause an electronic device positioned on the support cradle to be received in a non-vertical and non-horizontal manner, and wherein the angled front wall causes the housing's internal wall to direct and concentrate airflow towards the cradle's at least one air exchange opening.

8. The apparatus of claim 6, wherein the front wall comprises one or more upper support pads at or adjacent to a top edge of the front wall member.

9. The apparatus of claim 1, wherein the electronic device vent area is located along the bottom edge with at least one air intake vent centrally located in the vent area and at least one air exhaust vent located at one or both ends of the vent area.

10. The apparatus of claim 9, wherein one or more air seals extends substantially along width of the lower pad and support cradle to restrict air flow from passing between the support cradle and the device in the vicinity of the centrally located air intake, and wherein airflows into the device's centrally located air intake vent and exhausts out the device's exhaust vents at one or both ends raised and extended beyond the apparatus side walls.

11. An apparatus for supporting and cooling an electronic device with at least one air vent on a vent area of the electronic device, the apparatus comprising:
    a housing with side walls, a front wall, a rear wall, and an internal area between the side walls, the front and rear walls, the rear wall having one or more openings to permit air to pass through the rear wall;
    a fan member positioned in the internal area and configured to cause air to pass through the one or more openings in the rear wall; and
    a support cradle extending beyond the front wall of the housing to receive an edge of the electronic device on a top surface of the support cradle, the support cradle having first and second opposing wall members extending along the width of the support cradle that define a u-shaped structure with open sides at the ends of the first and second opposing walls, the support cradle having a top surface that comprising at least one air exchange opening to allow air to pass through the top surface of the cradle,
    wherein the top surface of the support cradle rises above a bottom surface of the apparatus,
    wherein the top surface of the support cradle comprises a lower support pad with one or more openings aligned with the at least one air exchange opening,
    wherein the lower pad comprises one or more air seals that extend outward from the top surface of the lower pad to engage with the device in the vicinity of the as least one air vent and restrict air movement between the support cradle and the electronic device at the location of the one or more air seals, wherein the one or more air seal extends substantially along width of the lower pad and support cradle to restrict air flow from passing between the electronic device and support cradle so that all of the air from the fan is delivered through the air exchange opening to the electronic device, and wherein the second opposing wall member comprises one or more front pads extending vertically from a front portion of support cradle, the one or more front pads are configured to engage with the electronic device to restrict movement of the device away from the one or more air seals, and the one or more front pads are readily configured with adjustable sliding position or removable from the support cradle.

12. The apparatus of claim 11, wherein the one or more air seals are formed of a material that is capable of conforming to the external shape of the electronic device at the area of contact to create a seal at the area of contact.

13. The apparatus of claim 11, wherein the fan member is arranged substantially vertically within the internal area, such that the operation of the fan will cause air to move in a direction that is generally perpendicular to the rear wall.

14. The apparatus of claim 13, wherein the fan member is mounted in the internal area adjacent the rear wall.

15. The apparatus of claim 11, wherein the front wall extends upwards from the support cradle to support a side of the electronic device when the electronic device is positioned on the support cradle.

16. The apparatus of claim 15, wherein the front wall extends upwards at an angle greater than 90 degrees and less than 135 degrees relative to the bottom surface of the apparatus to cause an electronic device positioned on the support cradle to be received in a non-vertical and non-horizontal manner, and wherein the angled front wall causes the housing's internal wall to direct and concentrate airflow towards the cradle's at least one air exchange opening.

17. The apparatus of claim 15, wherein the front wall comprises one or more upper support pads at or adjacent to a top edge of the front wall member.

18. The apparatus of claim 11, wherein the electronic device vent area is located along the bottom edge with at least one air intake vent centrally located in the vent area and at least one air exhaust vent located at one or both ends of the vent area.

19. The apparatus of claim 18, wherein one or more air seals extends substantially along width of the lower pad and support cradle to restrict air flow from passing between the support cradle and the device in the vicinity of the centrally located air intake, and wherein airflows into the device's centrally located air intake vent and exhausts out the device's exhaust vents at one or both ends raised and extended beyond the apparatus side walls.

* * * * *